United States Patent
Hisamoto et al.

(10) Patent No.: US 7,132,718 B2
(45) Date of Patent: Nov. 7, 2006

(54) FABRICATION METHOD AND STRUCTURE OF SEMICONDUCTOR NON-VOLATILE MEMORY DEVICE

(75) Inventors: Digh Hisamoto, Kokubunji (JP); Shinichiro Kimura, Kunitachi (JP); Kan Yasui, Kodaira (JP); Nozomu Matsuzaki, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/726,507

(22) Filed: Dec. 4, 2003

(65) Prior Publication Data
US 2004/0119107 A1   Jun. 24, 2004

(30) Foreign Application Priority Data
Dec. 4, 2002   (JP)   ............................ P2002-352040

(51) Int. Cl.
 H01L 29/76 (2006.01)
 H01L 29/94 (2006.01)
 H01L 31/062 (2006.01)
 H01L 31/113 (2006.01)
 H01L 31/119 (2006.01)

(52) U.S. Cl. ........................ 257/407; 257/314; 257/315; 257/316

(58) Field of Classification Search .............. 257/407, 257/314–316, E21.179
See application file for complete search history.

(56) References Cited

U.S. PATENT DOCUMENTS

| 5,821,581 A * | 10/1998 | Kaya et al. ................. 257/321 |
| 5,877,523 A * | 3/1999 | Liang et al. ................. 257/315 |
| 5,969,383 A | 10/1999 | Chang et al. |
| 5,977,591 A * | 11/1999 | Fratin et al. ................. 257/344 |
| 6,184,553 B1 * | 2/2001 | Odanaka et al. ............. 257/317 |
| 6,388,293 B1 * | 5/2002 | Ogura et al. ................. 257/365 |
| 6,449,189 B1 * | 9/2002 | Mihnea et al. ......... 365/185.18 |
| 6,768,165 B1 * | 7/2004 | Eitan ........................... 257/324 |
| 6,815,279 B1 * | 11/2004 | Yagishita et al. ............ 438/199 |
| 6,888,198 B1 * | 5/2005 | Krivokapic .................. 257/347 |
| 6,911,691 B1 * | 6/2005 | Tomiie et al. ............... 257/324 |

OTHER PUBLICATIONS

"Physics of Semiconductor Devices" second edition by S. Sze, published by Wiley-Interscience publication (USA) in 1981, 8.6 Nonvolatile Memory Devices, pp. 496-507.

* cited by examiner

Primary Examiner—Jerome Jackson
Assistant Examiner—Jesse A. Fenty
(74) Attorney, Agent, or Firm—Antonelli, Terry, Stout and Kraus, LLP.

(57) ABSTRACT

A non-volatile semiconductor memory device with good write/erase characteristics is provided. A selection gate is formed on a p-type well of a semiconductor substrate via a gate insulator, and a memory gate is formed on the p-type well via a laminated film composed of a silicon oxide film, a silicon nitride film, and a silicon oxide film. The memory gate is adjacent to the selection gate via the laminated film. In the regions on the both sides of the selection gate and the memory gate in the p-type well, n-type impurity diffusion layers serving as the source and drain are formed. The region controlled by the selection gate and the region controlled by the memory gate located in the channel region between said impurity diffusion layers have the different charge densities of the impurity from each other.

16 Claims, 22 Drawing Sheets

FABRICATION METHOD AND STRUCTURE OF SEMICONDUCTOR NON-VOLATILE MEMORY DEVICE

TECHNICAL FIELD OF THE INVENTION

The present invention relates to a non-volatile semiconductor memory device and the fabrication method thereof. More particularly, the present invention relates to a method for realizing a non-volatile semiconductor memory device with good write/erase characteristics.

BACKGROUND OF THE INVENTION

As an example of an integrated semiconductor memory incorporated in an LSI, there is a non-volatile memory. The non-volatile memory is a device characterized in that the stored data is not lost even when the power of the LSI is turned off, and it has become an extremely important device for using the LSI in various applications.

As an example of the non-volatile memory of the semiconductor device, there are a so-called floating gate memory and a memory using an insulator (see the following Non-Patent Document 1). It is known that the insulator-type memory, in which insulators are laminated and electric charge is stored in the traps at the interface of the insulators and those in the insulators, is not required to form new conductive layers in comparison to the floating gate memory and thus the memory has a good matching with the process for the CMOS LSI.

However, in the conventional memory in which electric charge is stored in the insulators (insulator-type memory), it is required to maintain the sufficient charge holding characteristics while repeating the charge injection and emission. Therefore, it is difficult to realize such a memory. For its solution, the technique for rewriting the stored data by injecting the charge with a different polarity instead of emitting the charge has been proposed (see the following Patent Document 1).

In this structure, the polycrystalline silicon gate (memory gate) for performing the memory operation and the gate for selecting the cell (selection gate) are separately formed. In this memory cell structure, two transistors composed of the memory gate and fundamentally based on the n-channel MOS are arranged on both sides of the selection gate. The gate insulator of the memory gate has a so-called MONOS (Metal-Oxide-Nitride-Oxide-Semiconductor (Silicon)) structure in which a silicon nitride film is sandwiched between two silicon oxide films. The gate insulator of the selection gate is composed of a silicon oxide film. The impurity diffusion layers (source, drain) are formed with using the selection gate and the memory gate as the masks.

Non-patent Document 1: pp. 496–506 in "Physics of Semiconductor Devices" second edition by S. Sze, published by Wiley-Interscience publication (USA) in 1981.

Patent Document 1: U.S. Pat. No. 5,969,383.

SUMMARY OF THE INVENTION

As the basic functions of the memory cell as mentioned above in which the polycrystalline silicon gate (memory gate) for performing the memory operation and the gate for selecting the cell (selection gate) are separately and adjacently arranged, there are four functions such as writing, erasing, holding, and reading. Note that the terms for indicating each of the four functions are used as typical examples, and it is also possible to use the terms of writing and erasing to indicate the opposite one. In addition, the operation thereof is also described using a typical case as an example. However, various operations are also available. In the embodiments, the memory cell formed of an n-channel MOS will be described. However, the memory cell can be similarly formed of a p-channel MOS in principle.

In the case of writing operation, positive potential is applied to the impurity diffusion layer on the side close to the memory gate and the ground potential similar to that of the semiconductor substrate is applied to the impurity diffusion layer on the side close to the selection gate. By applying to the memory gate the gate overdrive voltage higher than that of the impurity diffusion layer on the side close to the memory gate, the channel below the memory gate is turned on. In this case, by setting the potential of the selection gate to the value 0.1 or 0.2 V higher than the threshold value, the channel below the selection gate is turned on. At this time, since the strongest electric field is generated around the boundary between the two gates, a large number of hot electrons are generated and injected into the side near the memory gate. This phenomenon is known as the Source Side Injection (SSI). The feature of the hot electron injection in this manner is that electric field is concentrated around the boundary between the selection gate and the memory gate, and thus, the injection is sometimes concentrated on the edge portion of the memory gate at the side of the selection gate. Also, since the charge is stored in the insulator (gate insulator) below the memory gate, the electrons are trapped in an extremely small area.

In the case of erasing operation, negative potential is applied to the memory gate and the positive potential is applied to the impurity diffusion layer on the side close to the memory gate. By doing so, the strong inversion occurs in the region where the memory gate on the edge portion of the impurity diffusion layer on the side close to the memory gate and the impurity diffusion layer are overlapped. In this manner, the tunneling phenomenon between bands occurs and thus the holes can be generated. The generated holes are moved by the bias of the memory gate and are injected into the insulator (gate insulator) below the memory gate, thereby performing the erasing operation. More specifically, the threshold value of the memory gate increased by the charge of the electrons can be decreased by the charge of the injected holes. The feature of this erasing method is that, since the holes are generated in the edge portion of the impurity diffusion layer on the side close to the memory gate, the injected holes are concentrated on the edge portion of (the gate insulator below) the memory gate on the side close to the impurity diffusion layer.

In the case of holding operation, the charge is held as the charge of carriers injected into the insulator (gate insulator below the memory gate). Since the movement of the carriers in the insulator is extremely limited and slow, it is possible to hold the charge even if no voltage is applied to the electrode.

In the case of reading operation, the positive potential is applied to the impurity diffusion layer on the side close to the selection gate and the positive potential is applied to the selection gate. By doing so, the channel below the selection gate is turned on. At this time, an appropriate memory gate potential capable of distinguishing the difference in threshold values of the memory gate applied in the writing operation and erasing operation (that is, the intermediate potential between the threshold value in the writing operation and the threshold value in the erasing operation) is applied. In this manner, the held charge data can be read as a current.

As described above, the electrons and the holes generated in the writing operation and the erasing operation are respectively injected to different edge portions of (the gate insulator below) the memory gate. In the case of data reading, the charge data is determined based on the threshold value of the memory gate. Therefore, the difference in the positions of the charge injection may cause the reduction in efficiency of the writing and erasing operations, which will cause the reduction in performance of the non-volatile semiconductor memory device. Also, for the achievement of the good charge holding characteristics, it is desirable to form (a gate insulator made of) a laminated structure in which a layer containing a large number of charge traps (silicon nitride) is sandwiched between insulators such as silicon oxide with potential barrier height larger than that of silicon usually used to form a channel and a gate. In this case, however, it is necessary to cross over the barrier in order to effectively inject the charge.

In addition, since the selection transistor gains large readout current, it is desirable to reduce the thickness of the gate insulator thereof. Meanwhile, since the memory transistor holds the charge in the gate insulator, the gate insulator has a laminated structure with a large thickness. Due to the large thickness of the gate insulator, the threshold value of the memory transistor becomes extremely high.

An object of the present invention is to provide a non-volatile semiconductor memory device with good write/erase characteristics and a fabrication method thereof.

The above and other objects and novel characteristics of the present invention will be apparent from the description and the accompanying drawings of this specification.

The typical ones of the inventions disclosed in this application will be briefly described as follows.

In the non-volatile semiconductor memory device according to the present invention, the charge density of an impurity in the channel region controlled by the selection gate which constitutes the memory cell and the charge density of an impurity in the channel region controlled by the memory gate are respectively adjusted.

In the fabrication method of a non-volatile semiconductor memory device according to the present invention, when forming the memory cell structure, ion implantation is performed with using a selection gate as a mask, and then, a memory gate is formed.

BRIEF DESCRIPTIONS OF THE DRAWINGS

DESCRIPTION OF THE PREFERRED EMBODIMENTS

Figure 1:
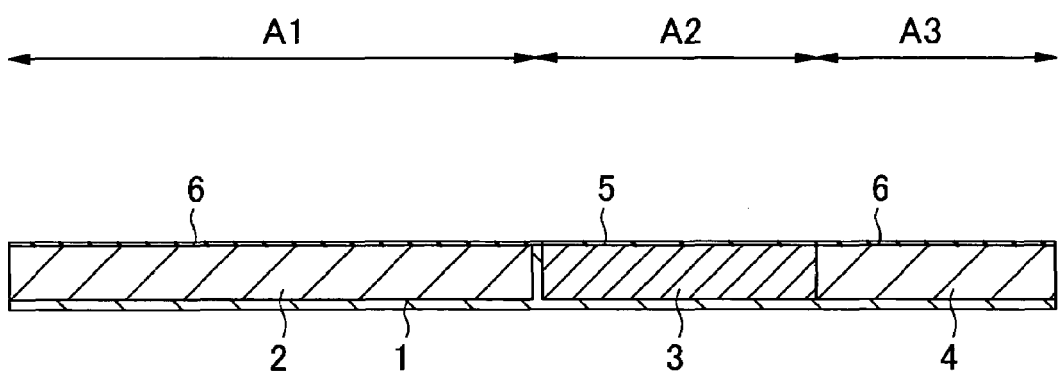
FIG. 1 is a sectional view showing the principal part of the non-volatile semiconductor memory device in the fabrication process according to an embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation.

Also, in the embodiments described below, when referring to the number of an element (including number of pieces, values, amount, range, and the like), the number of the element is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. This condition is also applicable to the numerical value and the range described above.

In addition, components having the same function are denoted by the same reference symbols throughout the drawings for describing the embodiment, and the repetitive description thereof is omitted.

Also, in the drawings used in the embodiments, hatching is used in some cases even in a plan view so as to make the drawings easy to see.

Hereinafter, the embodiments of the present invention will be described in detail with reference to the accompanying drawings.

(First Embodiment)

A non-volatile semiconductor memory device (semiconductor device) and a fabrication method thereof according to the first embodiment will be described with reference to the drawings. FIGS. 1 to 13 are sectional views showing the principal parts in the fabrication process of the non-volatile semiconductor memory device according to an embodiment of the present invention, in which FIG. 8 is an enlarged sectional view of FIG. 7.

FIGS. 1 to 13 illustrate the process for forming the semiconductor device in a memory cell region A1 and a memory peripheral circuit region. In addition, since the high voltage is required in the writing operation, a high breakdown voltage device region A2 and a normal device region A3 are formed in the memory peripheral circuit region. It is not always necessary to locate the memory cell region A1 adjacent to the memory peripheral circuit region (high breakdown voltage device region A2 and the normal device region A3). In FIGS. 1 to 13, however, the case where the memory peripheral circuit region is located adjacent to the memory cell region A1 is illustrated for easier understanding. In addition, the case where an n-channel MISFET (Metal Insulator Semiconductor Field Effect Transistor) is formed in the memory cell region A1 will be described in this embodiment. However, a p-channel MISFET with the opposite polarity can be formed in the memory cell region A1. Similarly, the case where an n-channel MISFET is formed in the memory peripheral circuit region will be described in this embodiment. However, a p-channel MISFET with the opposite polarity can be formed in the memory peripheral circuit region. Furthermore, it is also possible to form a CMOSFET (Complementary MOSFET) or a CMISFET (Complementary MISFET) in the memory peripheral circuit region. In addition, the process (fabrication process) in which a gate insulator is formed before forming a device isolation region is used in this embodiment to provide improved device characteristics. However, since the structure (for applying high electric field) in the present invention is essentially independent of the method for forming the device isolation region, the process for forming the gate insulator can be performed after the widely used device isolation process, for example, STI (Shallow Trench Isolation) and LOCOS (Local Oxidization of Silicon).

First, as shown in FIG. 1, a semiconductor substrate (wafer) 1 made of p-type single crystal silicon with a specific resistance of about 1 to 10 Ωcm is prepared. Next, after the thermal oxidation of the surface of the semiconductor substrate 1 (after forming a thermal oxide film), p-type wells 2, 3, and 4 are formed on the surface of the semiconductor substrate 1 by the ion implantation method (impurity such as boron are ion-implanted). The p-type wells 2, 3, and 4 are formed so as to extend from the main surface of the semiconductor substrate 1 to a predetermined depth.

Then, after the thermal oxide film is removed, the oxidation for forming a sacrificial oxide film is performed, and then, the sacrificial oxide film is removed. Thereafter, the gate oxidation is performed. At this time, since a gate insulator with the largest thickness is required in the high breakdown voltage device region (high breakdown voltage region) A2, the oxidation in accordance with the thickness (thickness of the gate insulator required in the high breakdown voltage device region A2) is performed to form a gate insulator 5 in the high breakdown voltage device region A2. The oxide film in the other regions (regions other than the high breakdown voltage device region A2) is removed by using the photolithography method and the like. Subsequently, the oxidation in accordance with (the thickness of gate insulators required in) the other regions A1 and A3 is performed to form a gate insulator 6 with a thickness of about 3 nm in each of the memory cell region A1 and in the device region A3. At the time of the second oxidation (when forming the gate insulator 6), the thickness of the gate insulator 5 already formed in the high breakdown voltage region A2 is increased (e.g., by 3 nm). Therefore, it is preferable to perform the first oxidation in expectation of the change in thickness (of the gate insulator 5). In the case where more seed layers are required, they can be formed by repeating the process described above. Also, it is known that the breakdown voltage of the oxide film in contact with the photoresist is decreased. Therefore, it is preferable to deposit a thin oxide film (silicon oxide film) with a thickness of about 5 nm on the semiconductor substrate 1 by the CVD (Chemical Vapor Deposition) method before coating the photoresist. Since the CVD film (silicon oxide film formed by the CVD method) has the higher etching rate (etched more easily) than that of the thermal oxide film (silicon oxide film formed by the thermal oxidation), it is possible to easily remove the CVD film simultaneously with the removal of unnecessary portion of the gate insulator (oxide film).

Figure 2:
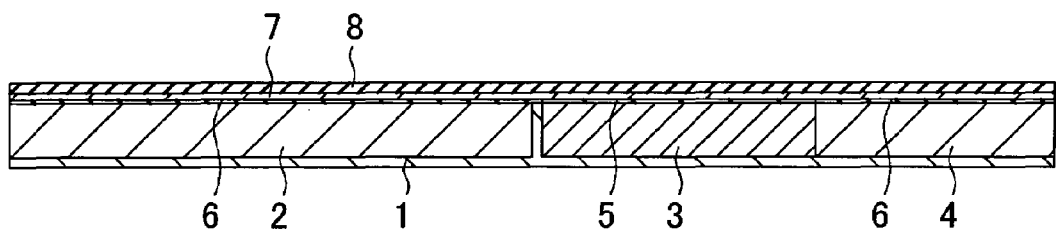
FIG. 2 is a sectional view showing the principal part at the step subsequent to FIG. 1 in the fabrication process of the non-volatile semiconductor memory device.

Next, after forming the gate insulators 5 and 6, a polycrystalline silicon film 7 and a silicon nitride film 8 are sequentially formed above the semiconductor substrate 1 by the CVD method as shown in FIG. 2. The thickness of the polycrystalline silicon film 7 is, for example, about 30 nm, and the thickness of the silicon nitride film 8 is, for example, about 50 nm.

Figure 3:
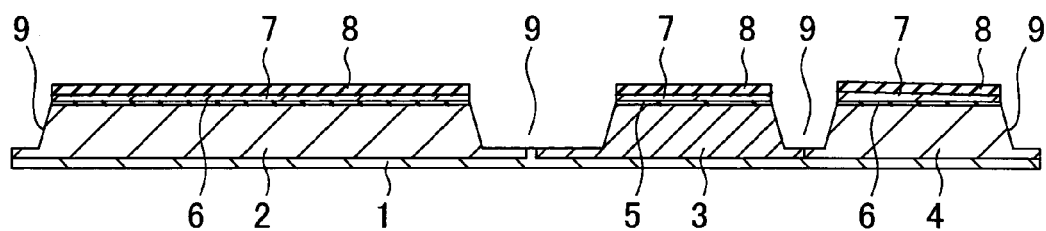
FIG. 3 is a sectional view showing the principal part at the step subsequent to FIG. 2 in the fabrication process of the non-volatile semiconductor memory device.

Next, as shown in FIG. 3, the silicon nitride film 8, the polycrystalline silicon film 7, the gate insulators 5 and 6, and the semiconductor substrate 1 (p-type wells 2, 3, and 4) are selectively etched to the depth of, for example, 300 nm by the photolithography method, thereby forming trenches 9 in the regions in which the device isolation regions are to be formed.

Figure 4:
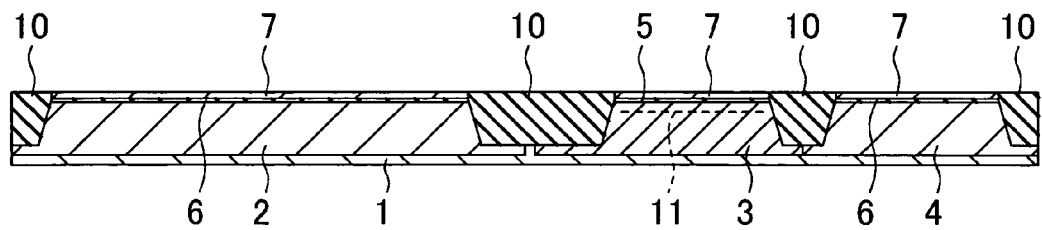
FIG. 4 is a sectional view showing the principal part at the step subsequent to FIG. 3 in the fabrication process of the non-volatile semiconductor memory device.

Next, as shown in FIG. 4, about 10 nm of the surface of the semiconductor substrate 1 (p-type wells 2, 3, and 4) exposed through the trench 9 is thermally oxidized, and then, a silicon oxide film with a thickness of, for example, about 500 nm is deposited above the semiconductor substrate 1 by the CVD method so as to fill the trench 9. Thereafter, the silicon oxide film is polished by the CMP (Chemical Mechanical Polishing) method. In this manner, the planarization process is performed until the surface of the silicon nitride film 8 is exposed and the silicon oxide is filled in the trenches 9 to form device isolation regions 10. Then, the silicon nitride film 8 is removed by, for example, the wet etching or the like. If necessary, a p-type impurity 11 (impurity functioning as acceptor) such as boron (B) can be ion-implanted (ion implantation) into the channel surface for setting the threshold value at this time. The case where the impurity 11 is ion-implanted into the region near the surface of the p-type well 3 in the high breakdown voltage region A2 is schematically shown in FIG. 4. However, the impurity 11 can also be ion-implanted into the region near the surface of the p-type well 2 in the memory cell region A1. By doing so, it becomes possible to adjust the impurity concentration (charge density of an impurity) in the channel region below the selection gate of the memory cell formed in the memory cell region A1. For example, the threshold value of the selection gate can be set to be the current value of $10^{-9}$ A/μm in the off state with Vcg=0 V. Note that the illustration of the ion-implanted impurity 11 is omitted in FIG. 5 and the subsequent drawings.

Figure 5:
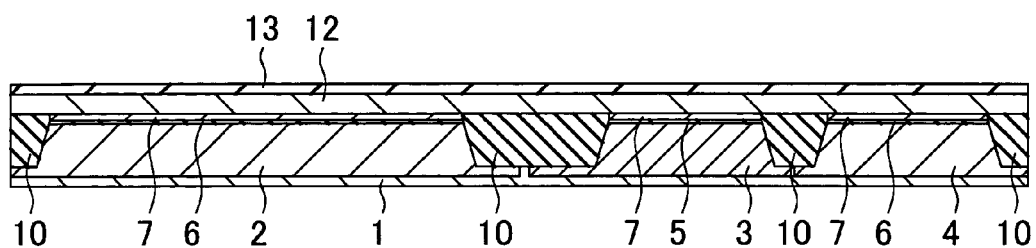
FIG. 5 is a sectional view showing the principal part at the step subsequent to FIG. 4 in the fabrication process of the non-volatile semiconductor memory device.

Next, as shown in FIG. 5, a polycrystalline silicon film 12 with a thickness of, for example, about 150 nm is deposited above the semiconductor substrate 1 by using the CVD method, and then, an impurity such as phosphorus (P) is doped to a high concentration into (the polycrystalline silicon film 12 in) the region where the n-channel MISFET is to be formed. Subsequently, a silicon oxide film 13 with a thickness of, for example, about 50 nm is laminated (formed) on the polycrystalline silicon film 12 by using the CVD method.

Figure 6:
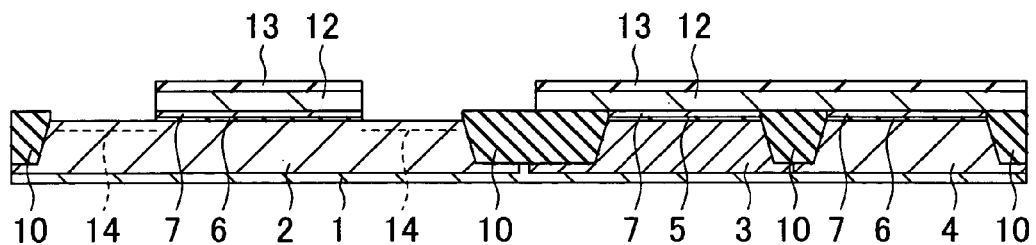
FIG. 6 is a sectional view showing the principal part at the step subsequent to FIG. 5 in the fabrication process of the non-volatile semiconductor memory device.

Next, as shown in FIG. 6, (the laminated film of) the silicon oxide film 13, the polycrystalline silicon film 12, and the polycrystalline silicon film 7 are selectively etched by using the photolithography method to pattern the region in which the memory gate of the memory cell is to be formed. By doing so, the regions in which the later-described memory gate and the impurity diffusion layer are to be formed are exposed. Then, as schematically shown in FIG. 6, an impurity 14 is ion-implanted (ion implantation) with using, as a mask, (the laminated film of) the patterned polycrystalline silicon film 7, the polycrystalline silicon film 12, and the silicon oxide film 13 to be a selection gate. It is possible to select the impurity 14 from a p-type impurity (e.g., boron) and an n-type impurity (e.g., arsenic or phosphorus) according to need. In this manner, the impurity 14 is introduced to the region where the memory gate is to be formed and to the adjacent region thereof in which the impurity diffusion layer is to be formed, and the impurity concentration (charge density of an impurity) in the region (channel region) below the memory gate formed later can be adjusted. Therefore, it becomes possible to increase the electric field generated by the PN junction with the impurity diffusion layer formed later, and also possible to set (adjust) the threshold value. In FIG. 6, the case where the impurity 14 is ion-implanted is schematically shown. However, the illustration of the ion-implanted impurity 14 is omitted in FIG. 7 and the subsequent drawings.

Figure 7:
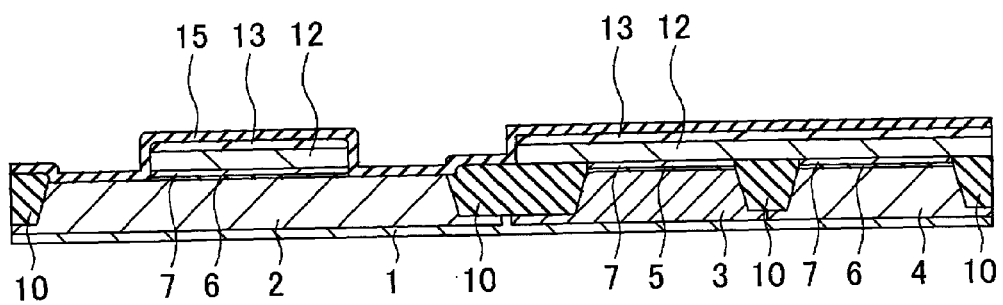
FIG. 7 is a sectional view showing the principal part at the step subsequent to FIG. 6 in the fabrication process of the non-volatile semiconductor memory device.
Figure 8:
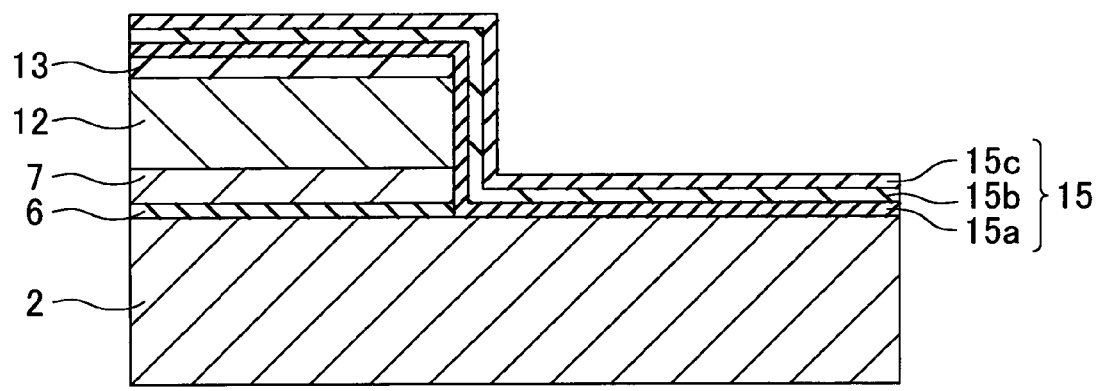
FIG. 8 is a partially enlarged sectional view of FIG. 7.

Next, as shown in FIG. 7 and FIG. 8 which is a partially enlarged sectional view of FIG. 7, which shows the part around the region where the memory gate is to be formed, after the oxidation for forming a sacrificial layer, a silicon oxide film 15a with a thickness of, for example, about 6 to 7 nm is formed above the semiconductor substrate 1 by the thermal oxidation, and then, a silicon nitride film 15b with a thickness of, for example, about 8 to 9 nm is deposited (formed) on the silicon oxide film 15a. Thereafter, a silicon oxide film 15c with a thickness of, for example, about 7 to 8 nm is deposited (formed) on the silicon nitride film 15b. In this manner, the laminated film 15 is formed. In FIG. 7, the laminated film of the silicon oxide film 15a, the silicon nitride film 15b, and the silicon oxide film 15c is shown as the laminated film 15 for the sake of easy understanding. Consequently, the thickness of the laminated film 15 is, for example, about 21 to 24 nm. It is also possible to obtain a high breakdown voltage film when the last oxide film (the uppermost silicon oxide film 15c in the laminated film 15) is formed by oxidizing the upper portion of the nitride film (the intermediate silicon nitride film 15b in the laminated film 15).

The laminated film 15 functions as a gate insulator of the memory gate formed later and has a charge holding function. Therefore, the laminated film 15 has a laminated structure of at least three layers, in which the potential barrier height of the inner layer is smaller in comparison to the potential barrier height of the outer layer. This can be achieved by forming the laminated film 15 so as to have a laminated structure of the silicon oxide film 15a, the silicon nitride film 15b, and the silicon oxide film 15c as described in this embodiment.

It is possible to form the silicon oxide film 15c by simply oxidizing the upper portion of the silicon nitride film 15b. However, since the growth of the oxide film (growth rate of the silicon oxide film by oxidizing the silicon nitride film 15b) is relatively slow, it is possible to form the silicon oxide film 15c in the following manner. That is, after depositing a silicon oxide film with a thickness of, for example, about 6 nm on the silicon nitride film 15b, only 1 nm of the upper portion of the silicon nitride film 15b is oxidized, and thus, the silicon oxide film 15c with the total thickness of about 7 nm is formed. By doing so, the film with good film quality can be obtained.

The thickness of each film constituting the laminated film 15 (thickness of the silicon oxide film 15a, the silicon nitride film 15b, and the silicon oxide film 15c) varies depending on the use of the semiconductor device (non-volatile semiconductor memory device) to be formed. Therefore, the typical examples of the thickness (value) of the films are shown in this embodiment, and the thickness is not limited to them. For example, the charge holding time can be increased by increasing the thickness of the oxide films (the silicon oxide films 15a and 15c) formed on and below the silicon nitride film 15b. In this case, the device will have the characteristics of the reduced readout current.

Figure 9:
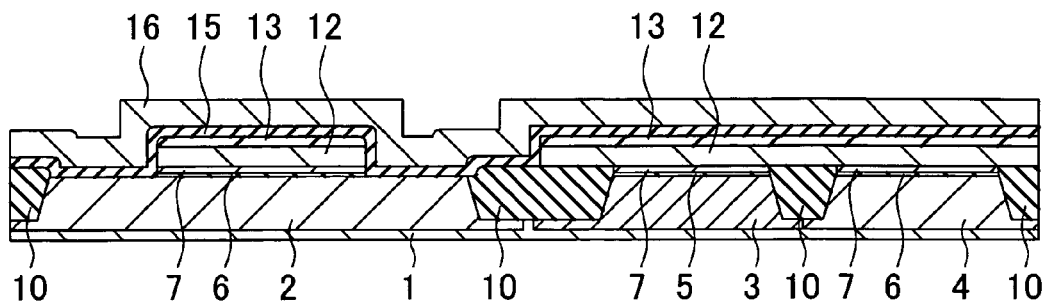
FIG. 9 is a sectional view showing the principal part at the step subsequent to FIG. 7 in the fabrication process of the non-volatile semiconductor memory device.
Figure 10:
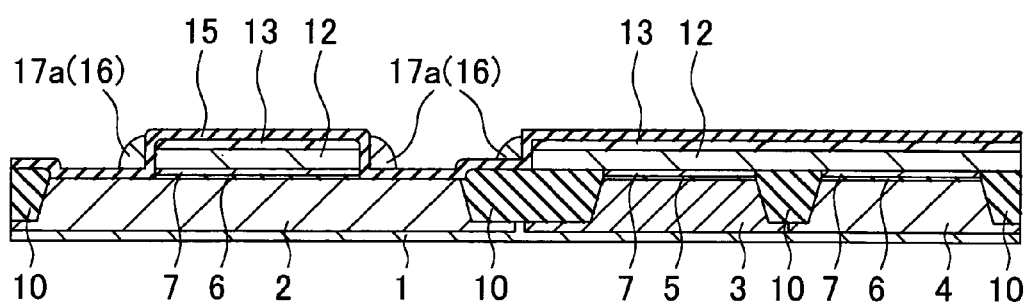
FIG. 10 is a sectional view showing the principal part at the step subsequent to FIG. 9 in the fabrication process of the non-volatile semiconductor memory device.

Next, as shown in FIG. 9, a polycrystalline silicon film 16 doped with phosphorus is deposited above the entire surface of the semiconductor substrate 1 by the CVD method. The thickness of the deposited polycrystalline silicon film 16 is, for example, about 100 nm. Then, as shown in FIG. 10, the polycrystalline silicon film 16 is etched (dry etching, anisotropic etching, and etching back) to the deposited thickness (about 100 nm). By doing so, polycrystalline silicon spacers (memory gate, gate electrode) 17a to be memory gates (gate electrode) are formed on the side surfaces of (the laminated structure of the polycrystalline silicon film 7, the polycrystalline silicon film 12, and the silicon oxide film 13 to be) the selection gate. More specifically, the polycrystalline silicon spacers 17a can be formed in the same manner as that for forming the insulating sidewalls (sidewall spacers) on the sidewalls of the gate electrode. Consequently, the polycrystalline silicon films 16 are left via the laminated film 15 on the sidewalls of the laminated structure of the polycrystalline silicon film 7, the polycrystalline silicon film 12, and the silicon oxide film 13, and the polycrystalline silicon film 16 in the other region is removed, and thus, the polycrystalline silicon spacers 17a made of the left polycrystalline silicon film 16 are formed. In addition, though not shown, the patterning of the extension portions by the photolithography method is performed simultaneously with the process for the polycrystalline silicon spacers 17a. More specifically, the polycrystalline silicon film 16 is not etched and left in the region where the contact holes connected to the memory gate in the latter step are to be formed.

Also, the memory gate length is determined depending on the deposition thickness of the polycrystalline silicon film 16. In other words, the memory gate length can be adjusted by adjusting the thickness of the polycrystalline silicon film 16 deposited above the semiconductor substrate 1. For example, it is possible to reduce the gate length by reducing the deposition thickness of the polycrystalline silicon film 16, and also possible to increase the gate length by increasing the deposition thickness of the polycrystalline silicon film 16. Since the tradeoff occurs between the channel controllability and the write/erase characteristics, the deposition thickness of the polycrystalline silicon film 16 is preferably set to 30 to 150 nm. However, in the case where the gate length of the selection gate is about 200 nm, it is desirable that the deposition thickness of the polycrystalline silicon film 16 is set to 50 to 100 nm. By doing so, it becomes possible to set the gate length of the memory gate to about 50 to 100 nm. In addition, the unnecessary portion of the polycrystalline silicon film 16 can be removed after this process.

Figure 11:
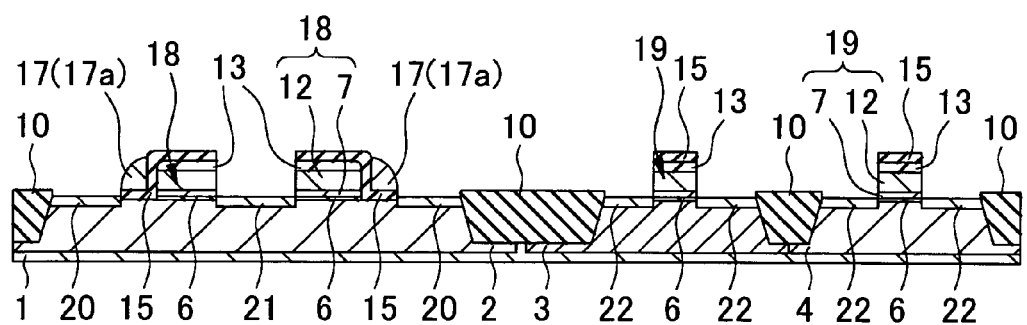
FIG. 11 is a sectional view showing the principal part at the step subsequent to FIG. 10 in the fabrication process of the non-volatile semiconductor memory device.

Next, after a p-type impurity is doped into the gate (polycrystalline silicon film 16) in the region where the p-channel MISFET (not shown) is to be formed, the process for the selection gate and the gate of the peripheral transistor is performed as shown in FIG. 11. More specifically, the polycrystalline silicon film 7, the polycrystalline silicon film 12, the silicon oxide film 13 and the laminated film 15 are selectively removed by using the photolithography method and the dry etching method. By doing so, selection gates (first gate, gate electrode) 18 and the gate electrodes 19 of the peripheral transistors (transistors such as MISFETs formed in the high breakdown voltage device region A2 and device region A3). At this time, unnecessary ones of the polycrystalline silicon spacers 17a are also removed, and the remaining polycrystalline silicon spacers 17a become memory gates (second gate, gate electrode) 17. The selection gate 18 extends in the direction vertical to the paper of FIG. 11. The memory gate 17 is formed on one of the sidewalls (side surface) of the selection gate 18 via the laminated film 15 and extends in the direction vertical to the paper of FIG. 11.

Subsequently, an (n-type) impurity such as arsenic (As) is doped by using the ion implantation method (with using the memory gate 17, the selection gate 18 and the gate electrode 19 as a mask). By doing so, n-type impurity diffusion layers (semiconductor region, impurity diffusion layer electrode) 20, 21, and 22 to be the source and drain (source/drain electrodes) are formed. The impurity diffusion layer (semiconductor region) 20 and the impurity diffusion layer (semiconductor region) 21 function as the source and drain of the memory cell formed in the memory cell region A1, and the impurity diffusion layers 22 function as the source and drain of the MISFET formed in the peripheral circuit region. In the structure of this embodiment, in the case of the erasing operation, holes are produced by making use of the so-called tunneling phenomenon between bands at the edge portion of the impurity diffusion layer 20. It is known that the efficiency of this hole production by the phenomenon depends on the impurity concentration (charge density of an impurity) in the impurity diffusion layer 20 and there is the optimum concentration. Thus, by performing the ion implantation of phosphorus (dose amount: $10^{13}$ to $10^{14}$ cm$^{-2}$) together with arsenic at the time when forming the impurity diffusion layer 20, the optimum concentration region (the region having the charge density of an impurity suitable for the hole production) can be formed on the side (edge portion) of the impurity diffusion layer formed by arsenic. More specifically, when comparing phosphorus and arsenic, phosphorus is diffused in the lateral direction (the direction parallel to the main surface of the semiconductor substrate 1) more easily than arsenic. Therefore, the region of the relatively low impurity concentration is formed at the outer edge portion of the impurity diffusion layer 20 rather than the central portion. In this manner, the extremely effective hole production can be achieved.

In addition, it is also possible to form a so-called Halo structure in which boron (boron diffusion layer) encircles the arsenic diffusion layer by the ion implantation of boron simultaneously with the formation of the impurity diffusion layer 20 by the use of (by the ion implantation of) arsenic. In this manner, it becomes possible to further increase the electric field.

Figure 12:
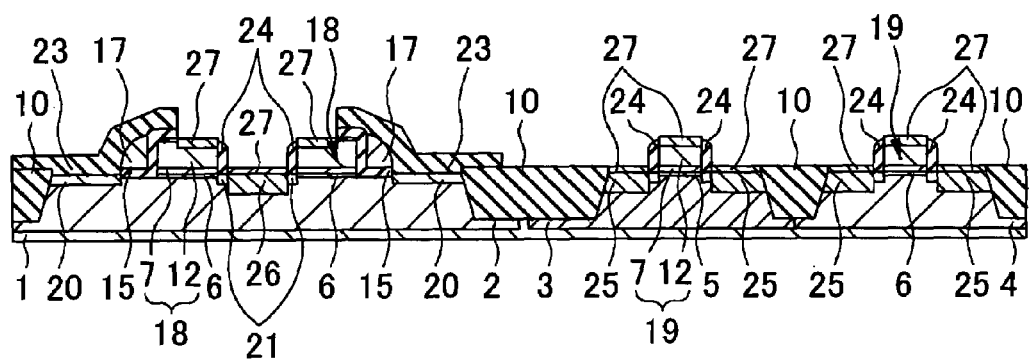
FIG. 12 is a sectional view showing the principal part at the step subsequent to FIG. 11 in the fabrication process of the non-volatile semiconductor memory device.

Next, as shown in FIG. 12, a silicon oxide film with a thickness of about 80 nm is formed above the semiconductor substrate 1, and the silicon oxide film is selectively etched (dry etching) and patterned by using the photolithography method. By doing so, spacers (insulating spacer, silicon oxide spacer) 23 made of silicon oxide are formed on the side surfaces of the gates (memory gate 17). The spacer 23 is formed so as to cover the memory gate portion. More specifically, the spacer 23 is formed so as to cover the memory gate 17 (polycrystalline silicon spacer 17a) and the impurity diffusion layer 20 and functions to isolate the memory gate 17 from the impurity diffusion layer 20. At this time, the silicon oxide film 13 and the laminated film 15 on the selection gate 18 and the gate electrode 19 are also removed by the etching (dry etching), and the (uppermost) polycrystalline silicon films 12 of the selection gate 18 and the gate electrode 19 are exposed. In addition, the oxide film is left on the sidewalls of the selection gate 18 and the gate electrode 19 to form sidewalls (sidewall spacers) 24.

In addition, by doping an (n-type) impurity such as arsenic into the regions on both sides of the gate electrode 19 and the sidewalls 24 thereof, impurity diffusion layers 25 with high impurity concentration can be formed, and thus, the LDD (Lightly Doped Drain) structure can be obtained. Similarly, by doping an (n-type) impurity such as arsenic into the region between the sidewalls 24 of the adjacent gate electrodes 19, n-type impurity diffusion layers (n-type semiconductor region) 26 with high impurity concentration can be formed, and thus, the LDD (Lightly Doped Drain) structure can be obtained.

Then, a silicide layer 27 is formed by a known salicide method using cobalt. More specifically, a cobalt (Co) film is deposited on the semiconductor substrate 1 and the thermal treatment is performed, thereby forming a silicide layer 27 on the selection gate 18 and the gate electrode 19 and on the impurity diffusion layers 25 and 26. Thereafter, the unreacted cobalt film is removed. Note that, by forming the spacer 23 without the patterning process and then depositing a thin oxide film, it becomes possible to limit the portion where the silicide is to be formed. Consequently, the finer process can be realized.

Figure 13:
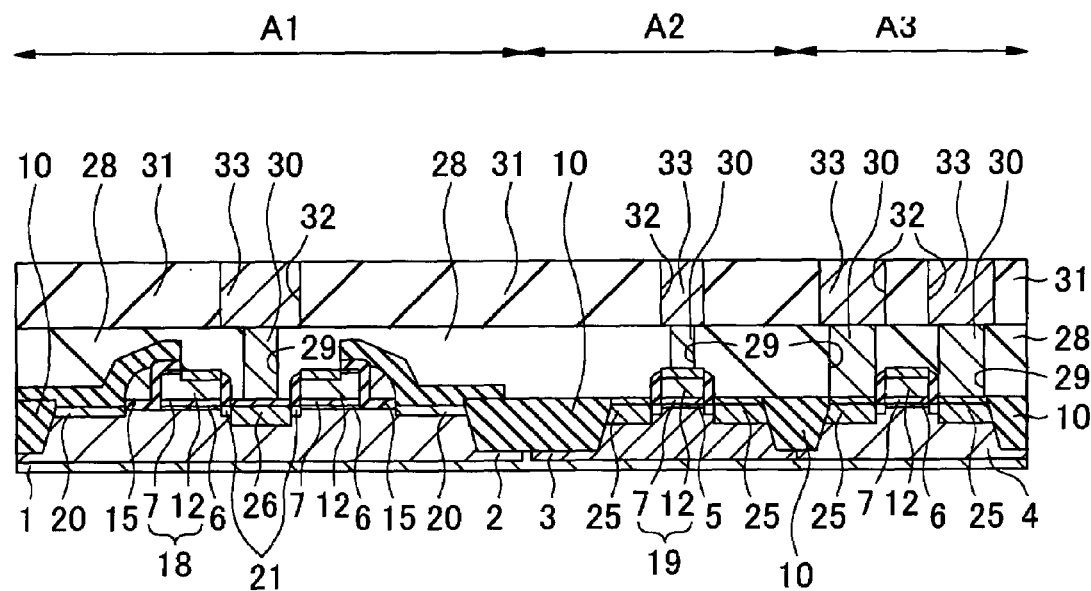
FIG. 13 is a sectional view showing the principal part at the step subsequent to FIG. 12 in the fabrication process of the non-volatile semiconductor memory device.

Next, as shown in FIG. 13, an interlayer insulator (insulator) 28 made of silicon oxide is formed above the semiconductor substrate 1. Then, contact holes 29 are formed in the interlayer insulator 28 by using the photolithography method and the dry etching method. At the bottom of the contact holes 29, some parts of the main surface of the semiconductor substrate 1, for example, a part of the impurity diffusion layers 20, 25, and 26 (or the silicide layer 27 thereon) and a part of the gate electrodes 17, 18, and 19 (or the silicide layer 27 thereon) are exposed.

Next, plugs 30 made of tungsten (W) are formed in the contact holes 29. The plug 30 can be formed in the manner as follows. That is, a titanium nitride film serving as a barrier film is formed on the interlayer insulator 28 including the inner surface of the contact holes 29, and then, a tungsten film is formed on the titanium nitride film by the CVD method so as to fill the contact holes 29. Thereafter, the unnecessary tungsten film and the titanium nitride film on the interlayer insulator 28 are removed by the CMP method or the etch-back method.

Next, an interlayer insulator 31 is formed on the interlayer insulator 28 in which the plugs 30 are embedded. Then, wiring openings 32 are formed in the interlayer insulator 31 by using the photolithography method and the dry etching method. Thereafter, a barrier insulator made of titanium nitride and a copper film are formed on the interlayer insulator 31 so as to fill the wiring openings 32, and then, the CMP method is performed to polish the films. In this manner, wirings (first layer wiring) 33 are formed in the wiring openings 32. The wirings 33 are electrically connected to the impurity diffusion layers 20, 25, and 26 and the gate electrodes 17, 18, and 19 via the plugs 30. The wiring 33 made of aluminum is also available. For example, the aluminum wiring can be formed by depositing a titanium film, a titanium nitride film, an aluminum film, a titanium film, and a titanium nitride film on the interlayer insulator 28 and patterning the films by using the photolithography method.

Thereafter, upper wirings and the like are formed according to need. However, the description for the process is omitted here. As described above, the non-volatile semiconductor memory device (semiconductor device) according to this embodiment is fabricated.

Figure 14:
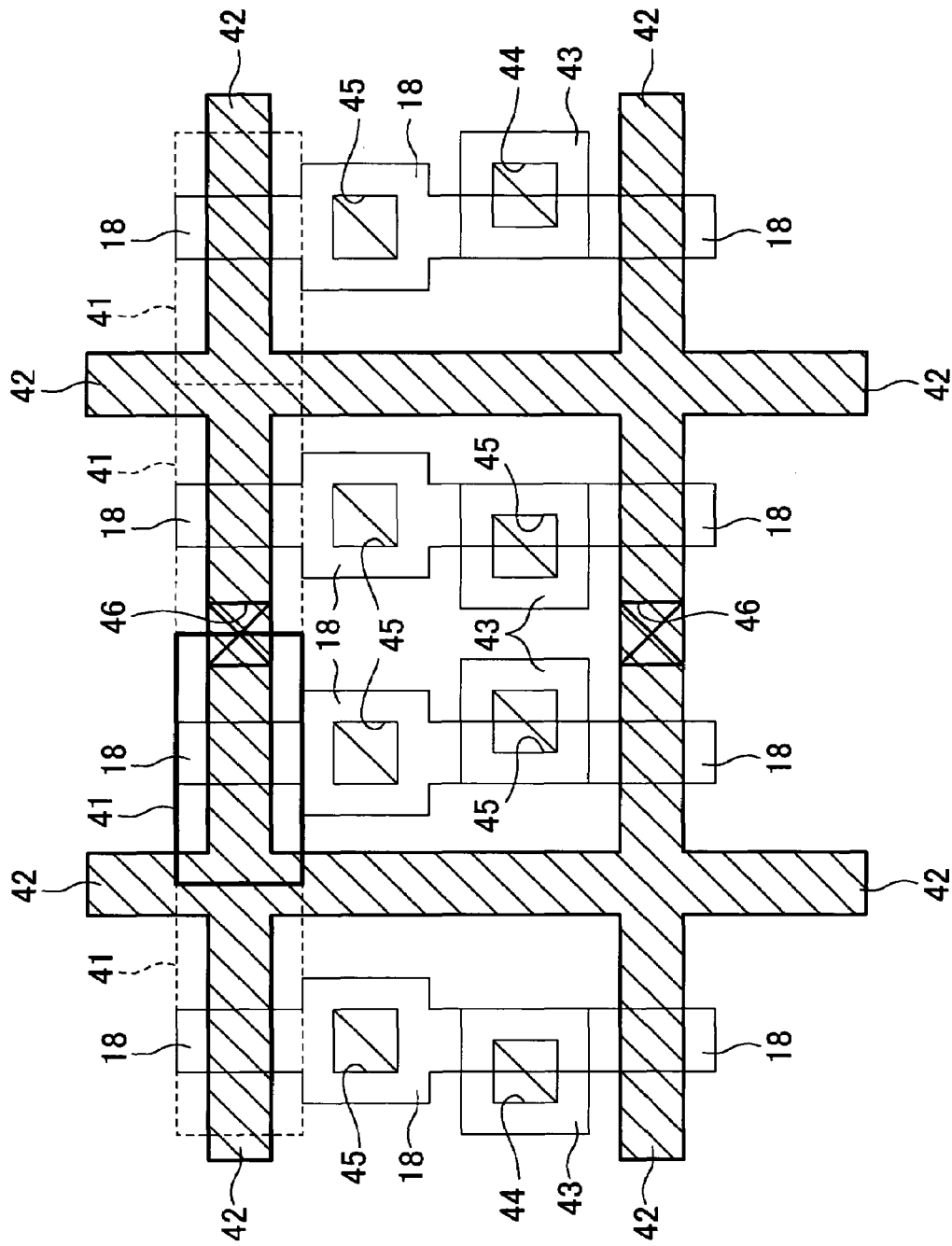
FIG. 14 is a plan view showing the principal part of the non-volatile semiconductor memory device according to an embodiment of the present invention.

FIG. 14 is a plan view (layout diagram) of a memory cell array in which memory cells of the non-volatile semiconductor memory device according to this embodiment are arranged in a matrix form, which shows the typical layout of the components.

In FIG. 14, the typical layout is shown with a focus on the shunt portion (connection portion) with the wiring layer. Two memory cells are arranged along the lateral direction in the memory cell region A1 shown in the sectional view of FIG. 13. However, in the plan view of FIG. 14, four memory cells are arranged along the lateral direction of FIG. 14, and two lines of four memory cells, that is, a total of eight memory cells are arranged in the plan view of FIG. 14. Note that boundaries 41 of the cells corresponding to those of the upper four cells (memory cells) are shown in FIG. 14. Also, the metal layers (wiring and plug) are omitted and only the contact holes are shown.

In FIG. 14, active regions 42 and the selection gates 18 are shown. Also, though not shown in FIG. 14, the memory gate 17 is formed on the one of the sidewalls of the selection gate 18 as described above, and the memory gate is extended by the extension portion 43 through the contact hole 44 for the memory gate. Therefore, in FIG. 14, the memory gate 17 (not shown) is formed on the sidewall of the selection gate 18 on the side where the extension portion 43 is provided. Note that the extension portion 43 of the memory gate corresponds to the portion obtained by forming a photoresist pattern on the polycrystalline silicon film 16 so as to prevent the etching of the polycrystalline silicon film 16 in the process shown in FIG. 10 in which the polycrystalline silicon spacer 17a (memory gate 17) is formed on the side surface of the selection gate 18 by the etch back of the polycrystalline silicon film 16. The selection gate 18 is extended through the contact hole 45 for the selection gate, and the region corresponding to the impurity diffusion layer 20 in the active region 42 is extended through the contact hole 46 for the source. FIG. 14 corresponds to the layout in the case where the impurity diffusion layer 26 (impurity diffusion layer 21) on the side close to the selection gate is used as a common component.

Figure 15:
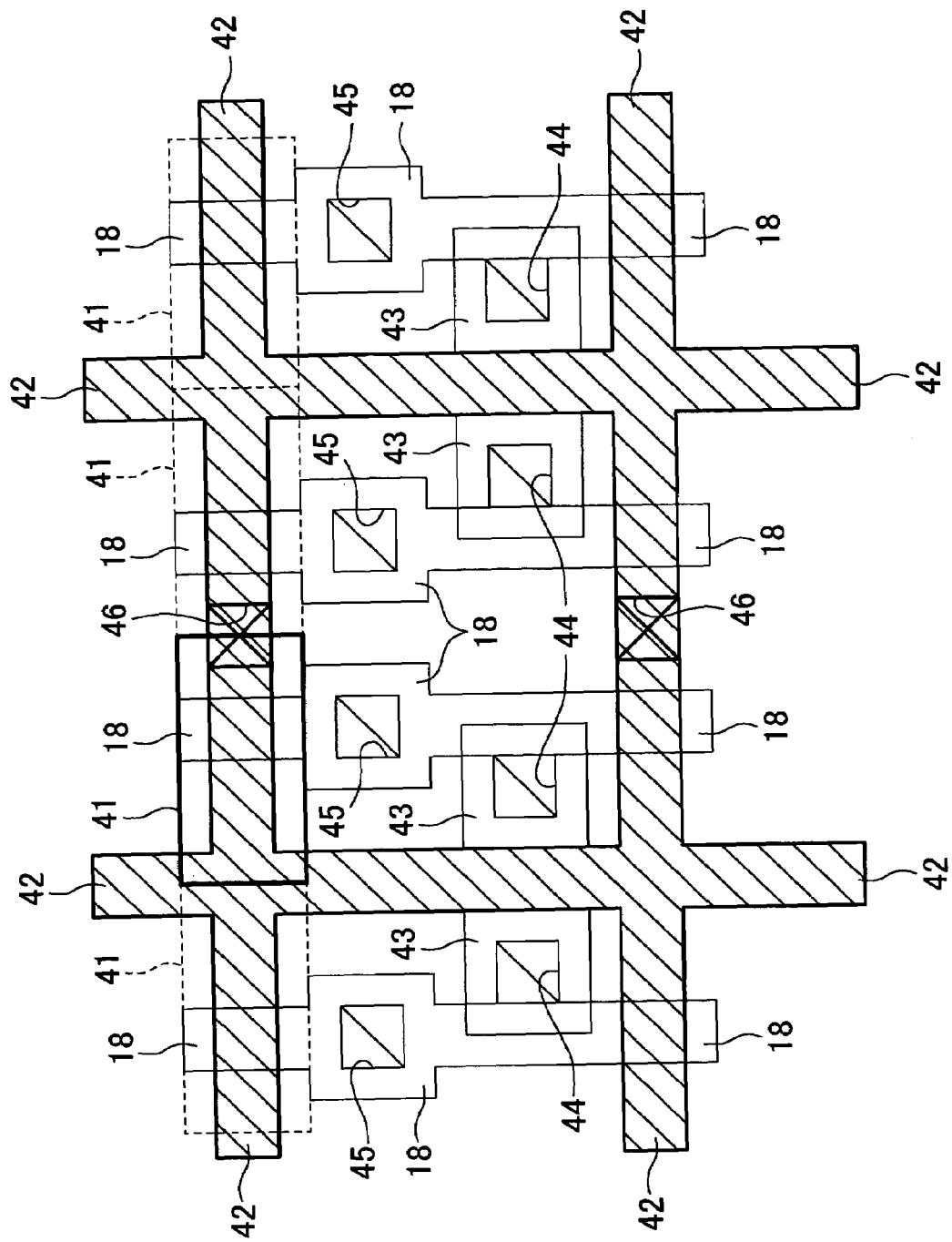
FIG. 15 is a plan view showing the principal part of the non-volatile semiconductor memory device according to another embodiment.

FIG. 15 is a plan view showing another example of the memory cell array of the non-volatile semiconductor memory device according to another embodiment, in which the same components as those shown in FIG. 14 are shown. FIG. 14 shows the layout in which the impurity diffusion layer (impurity diffusion layer 21, 26) on the side close to the selection gate 18 is used as a common component, and FIG. 15 shows the layout of the same cells in which the impurity diffusion layer (impurity diffusion layer 20) on the side of the memory gate is used as a common component. Also in FIG. 15, though not shown, the memory gate 17 is formed on the sidewall of the selection gate 18 on the side where the extension portion 43 is provided. Since the other constitution is almost equal to that of FIG. 14, the description thereof is omitted here.

Figure 16:
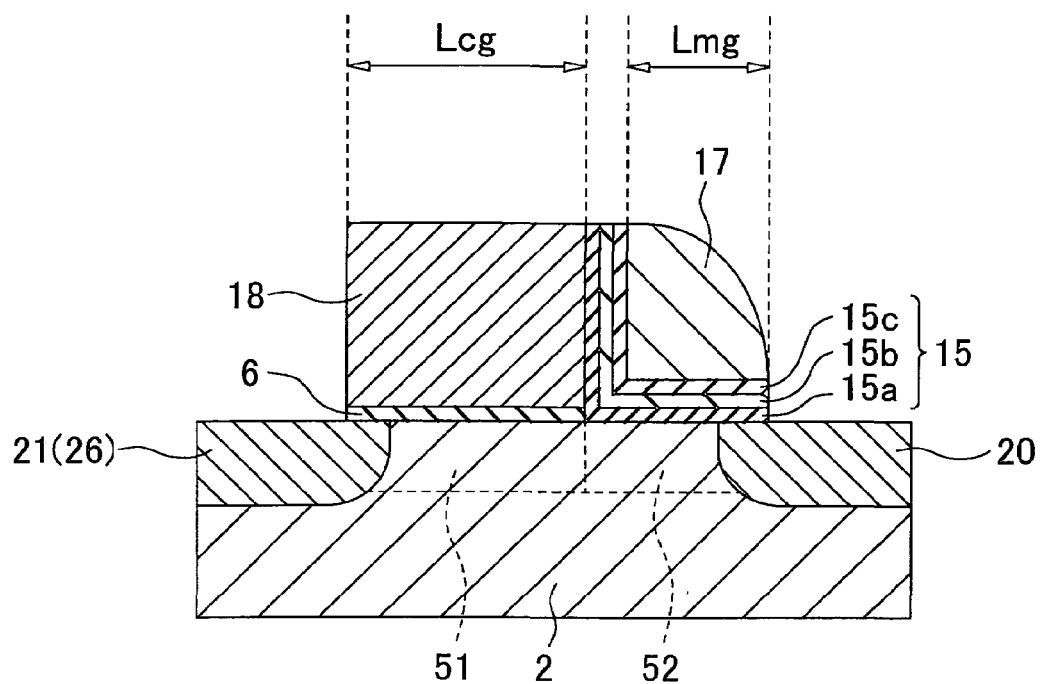
FIG. 16 is a sectional view showing the principal part of the memory cell structure of the non-volatile semiconductor memory device according to an embodiment of the present invention.

FIG. 16 is a (enlarged) sectional view showing the principal part of the memory cell structure of the non-volatile semiconductor memory device (semiconductor device)

according to this embodiment. One of the two memory cell structures formed in the memory cell region A1 in the manner as shown in FIGS. 1 to 13 is schematically shown in FIG. 16. Also, the p-type well 2, the gate insulator 6, the laminated film 15, the memory gate 17, the selection gate 18, the impurity diffusion layer 20, and the impurity diffusion layer 21 (impurity diffusion layer 26) are shown in FIG. 16, and the illustration of other components such as the sidewall 24 formed on the sidewall opposite to the memory gate 17 of the selection gate 18 is omitted for easy understanding.

As shown in FIG. 16, the memory cell of the non-volatile semiconductor memory device according to this embodiment is formed by connecting two MISFETs stacked vertically, each of which is comprised of the selection gate 18 and the memory gate 17. The laminated film 15 which is an ONO (Oxide Nitride Oxide) laminated film is used as the gate insulator of the memory gate 17, and thus, the so-called MONOS (Metal Oxide Nitride Oxide Semiconductor) structure is formed. Therefore, it is possible to hold the electric charge in the laminated film 15. The channel portion (channel region) located between the impurity diffusion layer 20 and the impurity diffusion layer 21 (impurity diffusion layer 26) is comprised of a region (first channel region) 51 below the selection gate 18 controlled by the selection gate 18 and a region (second channel region) 52 below the memory gate 17 controlled by the memory gate 17. More strictly, (the region corresponding to) the region sandwiched between the two gates (memory gate 17 and selection gate 18) is formed (in the channel region), and this region can be made extremely thin with the thickness equal to that of the ONO film (laminated film 15).

The typical operation of the memory cell structure shown in FIG. 16 will be described. Note that the potential of the impurity diffusion layer 20 serving as the source is defined as Vs, the potential of the memory gate 17 is defined as Vmg, the potential of the selection gate 18 is defined as Vcg, and the potential of the impurity diffusion layer 21 (impurity diffusion layer 26) serving as the drain is defined as Vd.

The potentials in the writing operation are: Vs=5 V, Vmg=10 V, Vcg=0.4 V, and Vd=0 V. The electrons can be injected into (the silicon nitride film 15b of) the laminated film 15 (below the memory gate 17) in the appropriate memory cells by applying the potentials as a pulse for, for example, $10^{-6}$ seconds. More specifically, it is possible to inject the electrons into the laminated film 15 by applying the potential higher than that of the impurity diffusion layer 21 to the impurity diffusion layer 20 and applying the potential higher than that of the impurity diffusion layer 20 to the memory gate 17.

The potentials in the erasing operation are: Vs=8 V, Vmg=−6 V, Vcg=0 V, and Vd=0 V. The holes (hot holes) can be injected into (the silicon nitride film 15b of) the laminated film 15 in the appropriate memory cells by applying the potentials as a pulse for, for example, $10^{-4}$ seconds. More specifically, it is possible to inject the holes into the laminated film 15 by applying the potential lower than that of the impurity diffusion layer 20 to the memory gate 17. In this case, Vcg is set to 0 V. However, it is also possible to inhibit the injection of the holes by applying the positive potential as Vcg. In addition, it is also possible to reduce the channel leakage current by setting Vd to be the floating potential.

The potentials in the reading operation are: Vs=0 V, Vmg=1.5 V, Vcg=1.5 V, and Vd=1.5 V. More specifically, the channel below the selection gate 18 is turned-on by applying the potential higher than that of the impurity diffusion layer 20 to the impurity diffusion layer 21 and applying the positive potential to the selection gate, and then, the intermediate potential between the threshold value of the writing operation and the threshold value of the erasing operation is applied as the potential of the memory gate 17. By doing so, the memory cell to which the electrons are written (injected) maintains the off state, but the memory cell in which the holes are held is turned on. More specifically, in the memory cell in which the electrons are injected in the laminated film 15 (by the writing operation) and the threshold voltage of the memory gate 17 is increased, little readout current flows between the impurity diffusion layer 20 and the impurity diffusion layer 21 (impurity diffusion layer 26). On the other hand, in the memory cell in which the holes are injected in the laminated film 15 (by the erasing operation) and the threshold voltage of the memory gate 17 is decreased, certain readout current flows between the impurity diffusion layer 20 and the impurity diffusion layer 21 (impurity diffusion layer 26).

As described above, when the electrons and the holes are injected in the laminated film 15 by the writing operation and the erasing operation, the characteristics (dependency) between the current flowing between the impurity diffusion layer 20 and the impurity diffusion layer 21 (impurity diffusion layer 26) and the voltage of the memory gate 17 can be changed due to the electric charge held by the carriers injected in the laminated film 15.

In this manner, since it is possible to rewrite the charge data by the use of the carriers of both types (electrons and holes) in the structure of this embodiment, the charge data can be easily read out. More specifically, it is possible to increase and decrease the threshold value in comparison to the initial state and the state having no injection charge. Therefore, it is possible to perform the reading operation keeping the memory gate to the holding state. By setting the holding/reading potential of the memory gate to the ground potential, the potential control of the memory gate can be facilitated.

Figure 17:
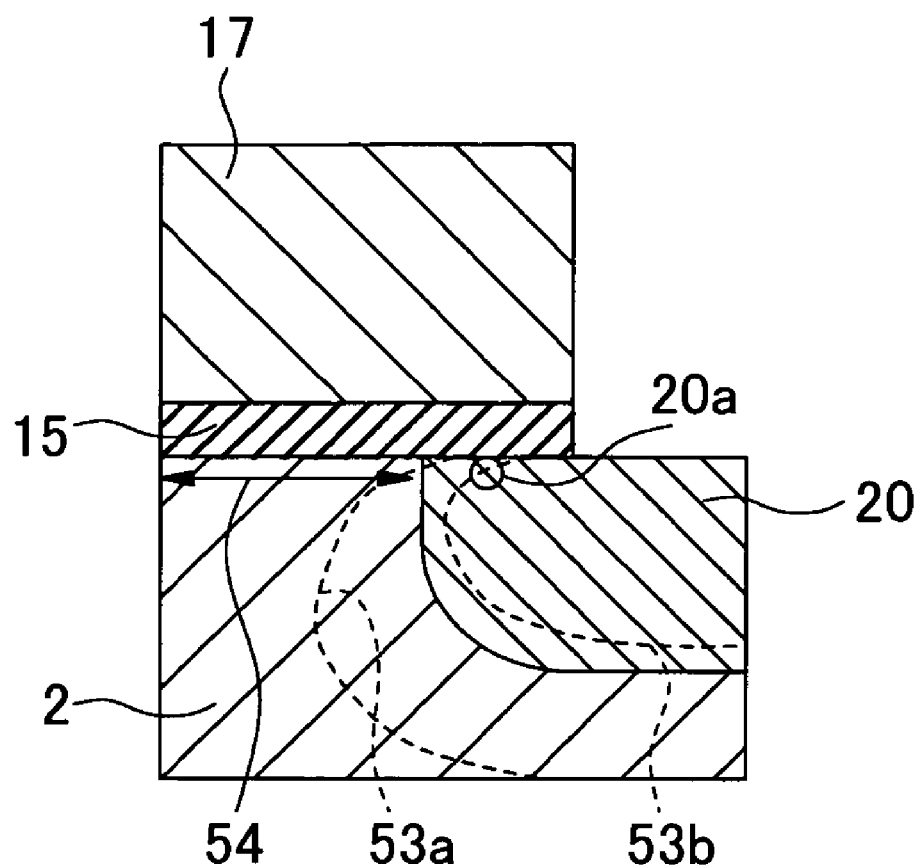
FIG. 17 is a partially enlarged sectional view around the edge portion of the memory gate of the memory cell structure in FIG. 16.

In the state of the memory erasing operation, the holes are strongly accumulated in the region 52. This state is shown in FIG. 17 in which the edge portion of the memory gate on the side close to the impurity diffusion layer 20 is enlarged. FIG. 17 is a partially enlarged sectional view showing the edge portion of the memory gate 17 on the side close to the impurity diffusion layer 20 in the memory cell structure in FIG. 16. In the erasing state, the positive potential is applied to the impurity diffusion layer 20 and the negative potential is applied to the memory gate 17. The depletion layer formed (generated) at this time in the semiconductor substrate (p-type well 2) is schematically shown in FIG. 17. In FIG. 17, the region sandwiched between the boundary 53a and the boundary 53b indicating the edges of the depletion layer is the depletion layer. At this time, the holes are strongly accumulated via the gate insulator (laminated film 15) in the channel region 54 located outside the boundary 53a (i.e., outside the depletion layer). Considering the movement of the holes in the erasing operation, the holes generated at the edge portion (region around the edge portion) 20a of the impurity diffusion layer 20 are injected into the gate (gate insulator, laminated film 15). In order to inject the holes so as to expand in the channel direction, it is necessary to move the holes in the channel direction (lateral direction, direction parallel to the main surface of the semiconductor substrate 1, direction from the impurity diffusion layer 20 to the impurity diffusion layer 21).

Figure 18:
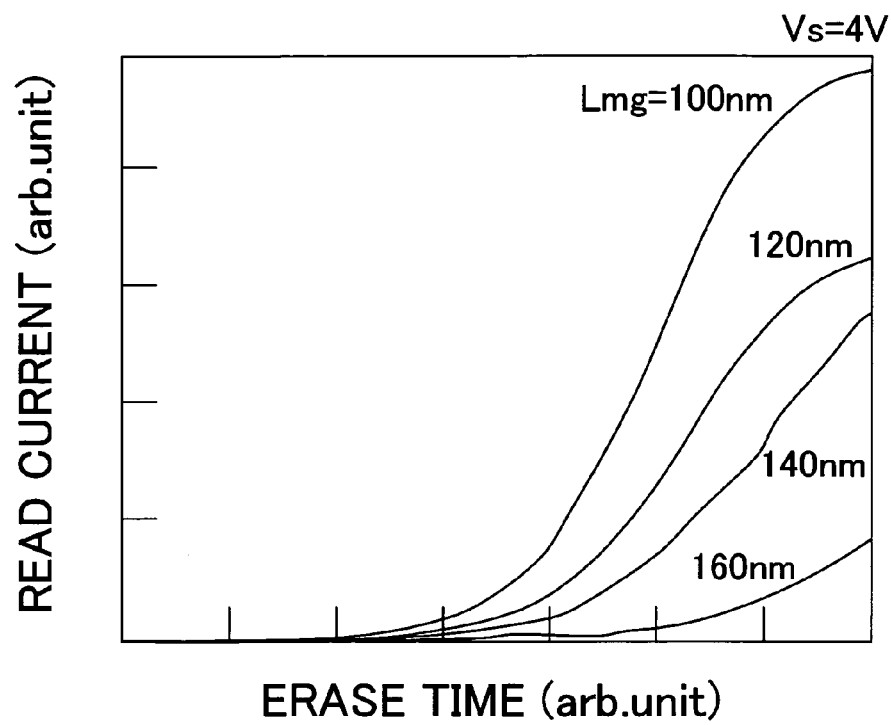
FIG. 18 is a graph showing the readout current when the holes are injected into the memory cell so that the electric current can flow.
Figure 19:
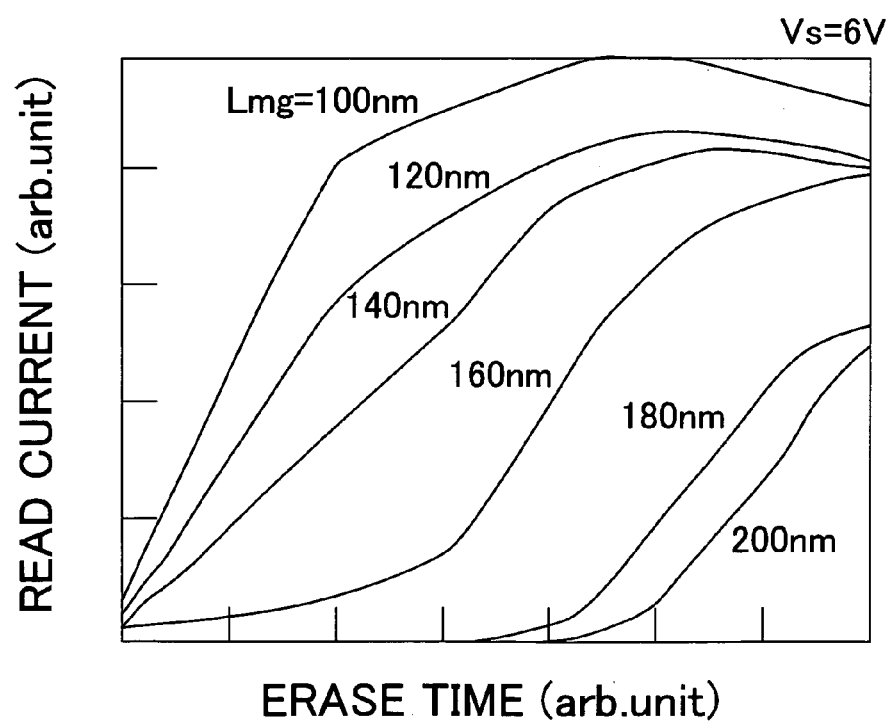
FIG. 19 is a graph showing the readout current when the holes are injected into the memory cell so that the electric current can flow.
Figure 20:
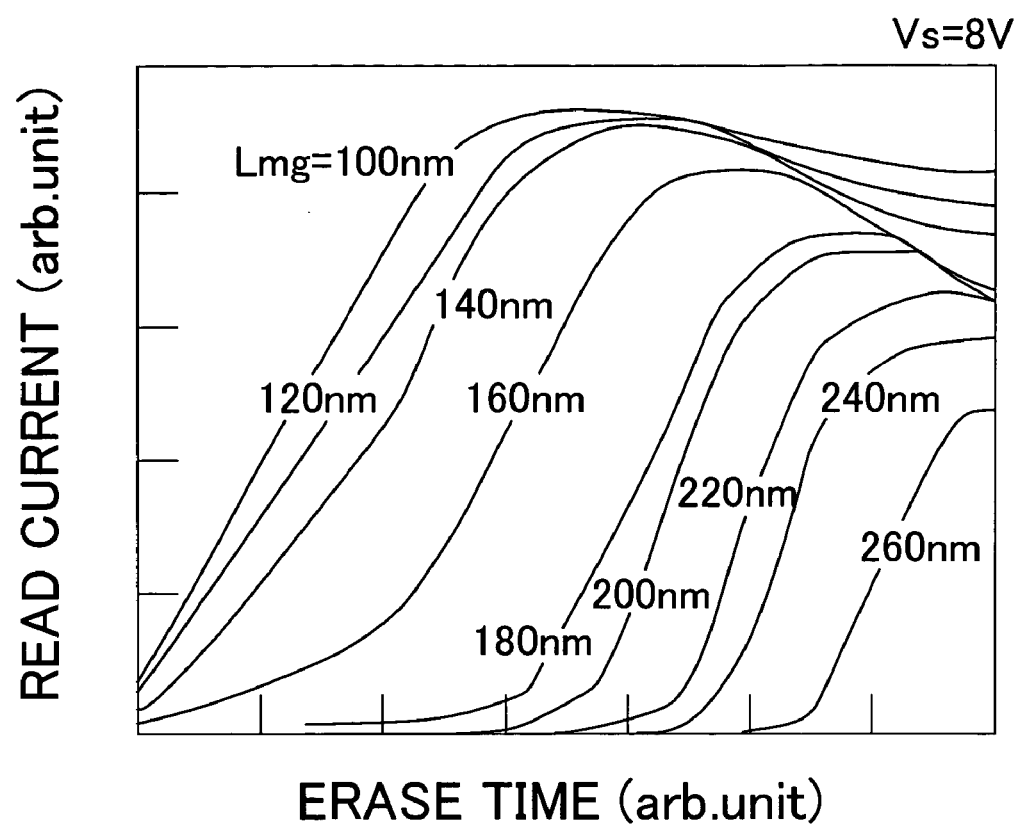
FIG. 20 is a graph showing the readout current when the holes are injected into the memory cell so that the electric current can flow.

For the description of the state, a sample device is fabricated in the manner as follows. That is, the channel length (gate length) Lcg of the selection gate 18 is fixed and the channel length (gate length) Lmg of the memory gate 17 is varied as a parameter, and also, since the charge holding portion (gate insulator) has a laminated structure of oxide films and a nitride film, a silicon oxide film, a silicon nitride film, and a silicon oxide film are laminated to form the memory cell. The fact that hole injection length by the lateral acceleration can be changed is demonstrated by the experiment using the sample devices, which is shown in the graphs of FIGS. 18 to 20. In the graphs of FIGS. 18 to 20, the readout current at the time when the current is allowed to flow by injecting the holes into the memory cell (performing the erasing operation) is plotted with using the channel length (gate length) Lmg of the memory gate as a parameter. FIGS. 18 to 20 show the erasing operation characteristics, in which the horizontal axis represents the erasing operation time and the vertical axis represents the readout current (in this case, current flowing between the impurity diffusion layer 20 and the impurity diffusion layer 21) at the time after performing the erasing operation, and each of them is described based on the arbitrary unit. In each of the graphs in FIGS. 18 to 20, the measurement of the erasing operation characteristics is performed while changing the potential Vs of the impurity diffusion layer 20 (source) at the time of the erasing operation (hole injection) performed before the reading operation. In this case, the erasing operation is performed under the conditions that Vmg is set to −7 V and Vs is set to 4 V (FIG. 18), 6 V (FIG. 19), and 8 V (FIG. 20), respectively. In each of the graphs in FIGS. 18 to 20, the case where the channel length Lmg of the memory gate is variously changed is shown. When the potential Vs at the erasing operation is small (in the case of FIG. 18), the readout current is generated only in the case where the channel length Lmg of the memory gate is short. However, when the potential Vs at the erasing operation is increased (in the case of FIGS. 19 and 20), the readout current can flow even in the case where the channel length Lmg of the memory gate is long. In addition, the current can flow even in the short-time erasing operation. This means that the holes can be injected into the entire memory gate by increasing the potential Vs at the erasing operation. More specifically, this means that, when the field in the horizontal direction is increased by applying the high voltage to the memory gate and the field in the horizontal direction (lateral direction, field in parallel to the main surface of the semiconductor substrate 1) at the edge portion of the impurity diffusion layer (region around the edge portion of the impurity diffusion layer 20) is increased, the generated holes are accelerated in the channel direction, and as a result, it becomes possible to obtain the good erasing efficiency.

Also, considering the above-mentioned phenomenon in the practical device, the channel impurity profile (impurity profile in the channel region) becomes the critical problem. More specifically, since the selection transistor gains the large readout current, it is preferable that the selection transistor has a gate insulator with a small thickness. Meanwhile, since the memory transistor holds the charge in its gate insulator, it has a laminated structure with a large thickness. Therefore, if the channel region of the selection transistor and the channel region of the memory transistor are set to have the same substrate impurity profile, the problem that the threshold value of the memory transistor becomes extremely high occurs due to the large thickness of the gate insulator. Thus, for obtaining the structure of the substrate/impurity diffusion layer with good erasing efficiency, it is important to establish the fabrication process by which the substrate structure (impurity profile) of the selection transistor and the memory transistor can be independently controlled.

This embodiment is characterized in that it is possible to minutely control the electric field below the memory gate 17 (region 52 in FIG. 16). The charge density of an impurity (impurity concentration) in the region 51 below the selection gate 18 can be controlled and determined depending on the impurity concentration introduced when forming the p-well 2. In addition, it is also possible to further control and determine the charge density of the impurity (impurity concentration) in the region 51 below the selection gate 18 by the ion implantation of the impurity 11. Alternatively, it is also possible to further control and determine the charge density of the impurity (impurity concentration) in the region 51 below the selection gate 18 by performing the ion implantation at the step shown in FIGS. 4 and 5.

Note that the charge in the depletion layer of the p-type impurity doped in the semiconductor region is negative and the charge of the n-type impurity is positive. Accordingly, if the impurities doped in a certain semiconductor region are the impurities with the same conductivity type, the polarity of the charges thereof is also the same. Therefore, the charge density of the impurity in the semiconductor region is equal to the total of the impurity concentrations. Meanwhile, if the impurities have the opposite conductivity types, the charges are canceled by each other. Therefore, the charge density of the impurity corresponds to the difference between the impurity concentration of one conductivity type and the impurity concentration of the other conductivity type. Thus, the charge density of the impurity corresponds to the impurity concentration when only one type of the impurity is doped. When several types of the impurity are doped, the charge density corresponds to the total of the impurity concentrations if the impurities have the same conductivity type, and the charge density corresponds to the difference in the impurity concentration between the impurity concentration of the one conductivity type and the impurity concentration of the other conductivity type if impurities have different conductivity types. For example, in the case where an n-type impurity (e.g., phosphorus) is doped with the concentration of $10^{18}/cm^3$ and another n-type impurity (e.g., arsenic) is doped with the concentration of $3 \times 10^{17}/cm^3$, the charge density of the impurity is the total of the impurity concentrations, that is, $1.3 \times 10^{18}/cm^3$. Also, in the case where an n-type impurity (e.g., phosphorus) is doped with the concentration of $10^{18}/cm^3$ and a p-type impurity (e.g., boron) is doped with the concentration of $3 \times 10^{17}/cm^3$, the charge density of the impurity is the difference between the impurity concentrations, that is, $7 \times 10^{17}/cm^3$. Note that, in the case where the valence of the charge of the doped impurity is 2 or more, the charge density of the impurity can corresponds to that obtained by multiplying the impurity concentration by the valence. Since the concentration of the n-type impurity is higher in the above-mentioned two examples, the regions function as n-type regions. When both the n-type impurity and the p-type impurity exist, the impurities are canceled by each other and thus only the difference therebetween can function as the actual impurity (donor or acceptor). Therefore, it can be considered that the charge density of the impurity corresponds to the actual impurity concentration in the semiconductor region.

Meanwhile, the charge density of the impurity (impurity concentration) in the region 52 below the memory gate 17 can be controlled and determined by patterning the polycrystalline silicon film 7, the polycrystalline silicon film 12, and the silicon oxide film 13 as shown in FIG. 6, and then, performing the ion implantation of the impurity 14 with using (the laminated film of) the patterned polycrystalline silicon film 7, the polycrystalline silicon film 12, and the silicon oxide film 13 as a mask which is to be the selection gate 18.

In the ion implantation of the impurity 14, the impurity 14 is not introduced (injected) into the region 51 below the selection gate 18 because the polycrystalline silicon film 7, the polycrystalline silicon film 12, and the silicon oxide film 13 formed thereon function as the mask. Consequently, in this embodiment, it is possible to differentiate the charge density of the impurity (impurity concentration) in the region 51 below the selection gate 18 from the charge density of the impurity (impurity concentration) in the region 52 below the memory gate 17.

The charge density of the impurity (impurity concentration) in the region (channel region) 52 below the memory gate 17 is preferably set to $10^{17}$ to $10^{18}/cm^3$, more preferably set to $3\times10^{17}/cm^3$ to $7\times10^{17}/cm^3$, and set to, for example, about $5\times10^{17}/cm^3$. The increase of the charge density of the impurity (impurity concentration) in the region 52 below the memory gate 17 is preferable because the energy gradient (generated by the PN junction) between the impurity diffusion layer 20 and the region 52 can be made steep (the electric field can be increased) and the lateral (direction parallel to the main surface of the semiconductor substrate 1, channel direction, direction of the channel length) movement of the holes from the impurity diffusion layer 20 to the region 52 can be facilitated. However, if the charge density of the impurity (impurity concentration) in the region 52 is excessively increased, the threshold value is decreased and the readout value after the erasing may become insufficient as the current value. Therefore, it is preferable to set the charge density of the impurity (impurity concentration) in the region 52 within the range described above.

Also, the charge density of the impurity in the region (first channel region) 51 below the selection gate 18 is preferably higher (larger) than the charge density of the impurity in the region (second channel region) 52 below the memory gate 17, and is set to, for example, about $10^{18}/cm^3$. If the impurity 14 having the conductivity type opposite to that of the region 51 (conductivity type of the impurity) is ion-implanted (to the region 52) with using the polycrystalline silicon film 7, the polycrystalline silicon film 12, and the silicon oxide film 13 on the region 51 as a mask, the charge density of the impurity in the region 52 to which the impurity 14 is introduced can be set lower than the charge density of the impurity in the region 51 to which the impurity 14 is not introduced. For example, the already-introduced p-type impurity (impurity functioning as an acceptor) is partially canceled by the n-type impurity (impurity functioning as a donor) ion-implanted into as the impurity 14 in the region 52. By doing so, the charge density of the impurity equivalent to the actual impurity concentration in the region 52 can be set lower than that in the region 52. In this case, the dose amount of the impurity 14 is adjusted so as to prevent that the ion implantation amount of the impurity 14 is too excessive and the conductivity type of the region 52 (p-type in this case) is changed to the opposite conductivity type (n-type in this case). Therefore, when the p-type impurity is introduced (doped) into the region 51 and the p-type impurity and the n-type impurity are introduced (doped) into the region 52, the charge density of the impurity in the p-type region 52 can be set lower than the charge density of the impurity in the p-type region 51. In addition, since the charge density of the impurity (impurity concentration) in the impurity diffusion layer 20 is higher in comparison to those in the region 51 and the region 52, the charge density can be almost determined by the impurity concentration introduced (ion-implanted) for forming the impurity diffusion layer 20 in the process shown in FIG. 11.

Since the selection transistor (having the selection gate 18 as its component) gains a large readout current, it is preferable to reduce the thickness of the gate insulator (gate insulator 6 below the selection gate 18). Meanwhile, since the memory transistor (having the memory gate 17 as its component) holds the charge in the gate insulator thereof, the gate insulator (laminated film 15 below the memory gate 17) thereof has a laminated structure with a large thickness composed of, for example, a silicon oxide film, a silicon nitride film, and a silicon oxide film. Therefore, the thickness of the gate insulator below the memory gate 17, that is, the thickness of the laminated film 15 in this case is relatively larger than the thickness of the gate insulator below the selection gate 18, that is, the thickness of the gate insulator 6 in this case. Accordingly, if the charge density of the impurity (impurity concentration) in the region 51 below the selection gate 18 is set equal to the charge density of the impurity (impurity concentration) in the region 52 below the memory gate 17, the problem that the threshold value of the memory transistor (memory gate 17) is extremely increased occurs because the gate insulator (laminated film 15) of the memory transistor is thicker than the gate insulator (gate insulator 6) of the selection transistor.

In this embodiment as described above, the charge density of the impurity (impurity concentration) in the region 51 below the selection gate 18 is not equal to the charge density of the impurity (impurity concentration) in the region 52 below the memory gate 17, and the charge density of each impurity (impurity concentration) can be adjusted to a desirable value by adjusting the conductivity type of the impurities at the time of the ion implantation and the implantation amount (dose amount) of the impurities. For example, as described above, the charge density of the impurity in the region (channel region) 51 below the selection gate 18 can be set higher than the charge density of the impurity in the region 52 below the memory gate 17. When the charge density of the impurity in the region 51 controlled by the selection gate 18 via a thinner gate insulator 6 is set relatively high and the charge density of the impurity in the region 52 controlled by the memory gate 17 via a laminated film 15 thicker than the gate insulator 6 is set relatively low, it is possible to prevent the problem that the threshold value of the memory transistor (memory gate 17) is extremely increased. In addition, the charge density of the impurity (impurity concentration) in the region 52 below the memory gate 17 can be adjusted to a desirable value independently of the charge density of the impurity (impurity concentration) in the region 51 below the selection gate 18, and it becomes possible to facilitate the movement of the holes in the lateral direction (direction parallel to the main surface of the semiconductor 1, channel direction, direction of the channel length) from the impurity diffusion layer 20 to the region 52. Furthermore, when the charge density of the impurity (impurity concentration) in the region 52 below the memory gate 17 is set to the optimum concentration for facilitating the movement of the holes in the lateral direction from the impurity diffusion layer 20 to the region 52, it becomes possible to improve the erasing efficiency.

Also, it is effective to set the threshold value of the selection gate 18 to be low so as to prevent the problem that the threshold value of the memory gate 17 (memory transistor) is influenced by the setting of the threshold value of the selection gate 18 (selection transistor). This can be achieved by reducing the charge density of the impurity (impurity concentration) in the channel. However, the reduction of the threshold value of the selection gate 18 causes the problem of the increase of the leakage (leakage current) at the time of the reading operation. For such a problem, the leakage can be reduced by shifting the potential of the selection gate (Vcg) not selected at the time of the reading operation to the negative side (set to the negative potential). In addition, if the potential of the diffusion layer is set higher in comparison to that of the selection gate at the time of the reading operation, the same effect as that in the case of applying the negative potential can be obtained. Therefore, it becomes unnecessary to generate the negative potential in a driver circuit of the selection gate 18. In addition, it is also possible to reduce the leakage by applying the negative potential to the semiconductor substrate at the time of the reading operation, that is, by the so-called back bias effect. In this case, since the doping amount of the impurity into the channel region below the memory gate 17 is small, it is possible to form the impurity diffusion layer and the channel distribution (impurity profile in the channel region) ideal for the memory gate 17.

Figure 21:
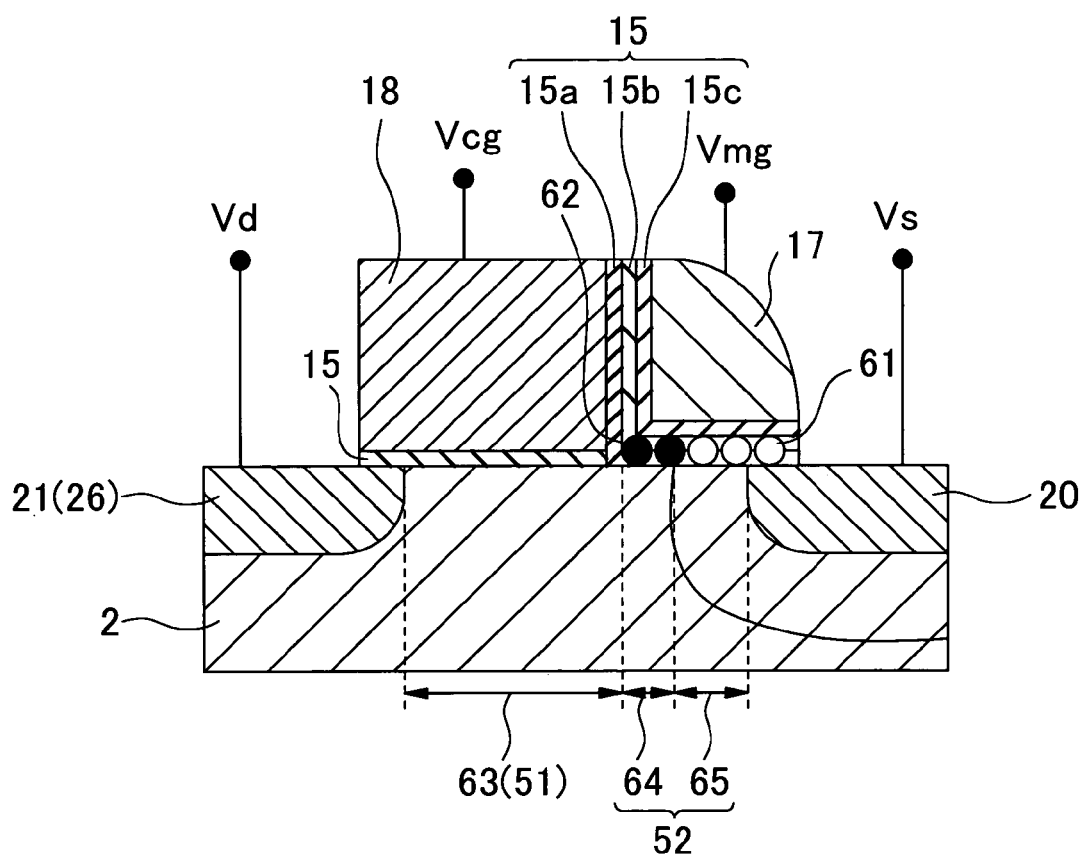
FIG. 21 is a sectional view schematically showing the state of the carriers injected into the memory cell in FIG. 16.

FIG. 21 is a sectional view schematically showing the state of the carriers injected in the memory cell shown in FIG. 16. In the memory cell structure of this embodiment, some of the holes are left on the side close to the impurity diffusion layer 20 and some the electrons 62 are left on the side close to the selection gate 18 as described above (disproportional distribution). In this case, in the manner opposite to the above-mentioned example, Vs is set to 1 V and the Vd is set to 0 V (apply the potential higher than that of the impurity diffusion layer 21 to the impurity diffusion layer 20) at the time of the reading operation. By doing so, it becomes possible to effectively read the data. More specifically, in FIG. 21, the channel (channel region) 63 corresponds to the region 51 in FIG. 16, the channel (channel region) 64 corresponds to the channel region 54 in FIG. 17, the boundary between the channel 64 and the channel (channel region) 65 corresponds to the boundary 53a in FIG. 17, and the combined region of the channel 64 and the channel 65 corresponds to the region 52 in FIG. 16. When the impurity diffusion layer 21 (impurity diffusion layer 26, impurity diffusion layer on the side close to the selection gate 18) is operated as a source and the impurity diffusion layer 20 (impurity diffusion layer on the side close to the memory gate 17) is operated as a drain (at the time of reading operation) (when the potential higher then that of the impurity diffusion layer 21 is applied to the impurity diffusion layer 20), since the electrons are present in the edge portion of the source (on the source side), it is possible to change the threshold value. Also, since the boundary 53a (boundary between the channel 64 and the channel 65) is extended, the region damaged by the hole injection is covered with the depletion layer. Therefore, it becomes possible to conceal the influence of the characteristics at the (damaged) interface. Also, since the channel 64 becomes extremely short at the time of the erasing (at the time of the erasing operation), it becomes possible to carry the large current.

Figure 22:
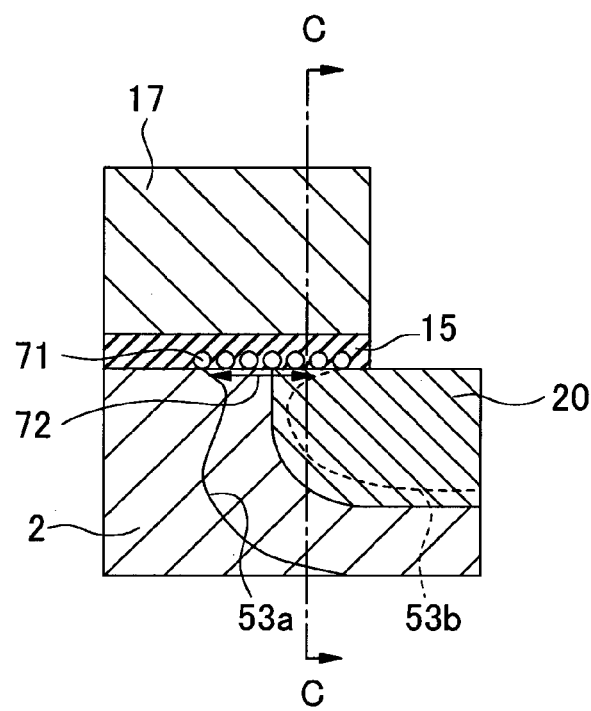
FIG. 22 is a sectional view schematically showing the state after the erasing operation around the edge portion of the memory gate 17.

FIG. 22 is a sectional view schematically showing the state around the edge portion of the memory gate 17 after the erasing (after the erasing operation, after the hole injection). FIG. 22 corresponds to the case in which the holes are injected into (the laminated film 15 of) the structure in FIG. 17. Since the holes are generated in the edge portion of the impurity diffusion layer 20 (in the region around the edge portion), holes 71 are injected in the part of the laminated film 15 (laminated insulator) ranging from directly above the edge portion of the impurity diffusion layer 20 to the channel. Therefore, as shown in FIG. 21, the edge portion of the depletion layer represented by the boundary 53a protrudes due to the electric charge of the holes 71 in the channel direction in comparison to the case in FIG. 17 (before the hole injection). Accordingly, the expansion (width in the lateral direction in FIG. 22) of the depletion layer (the region sandwiched between the boundary 53a and the boundary 53b) becomes large, and thus, the electric field in the lateral direction (electric field in the direction parallel to the main surface of the semiconductor substrate 1) is reduced.

Figure 23:
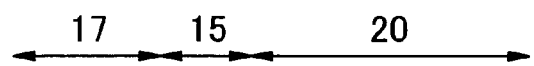
FIG. 23 is an explanatory diagram showing the potential distribution along the line C—C in FIG. 22.
Figure 23:
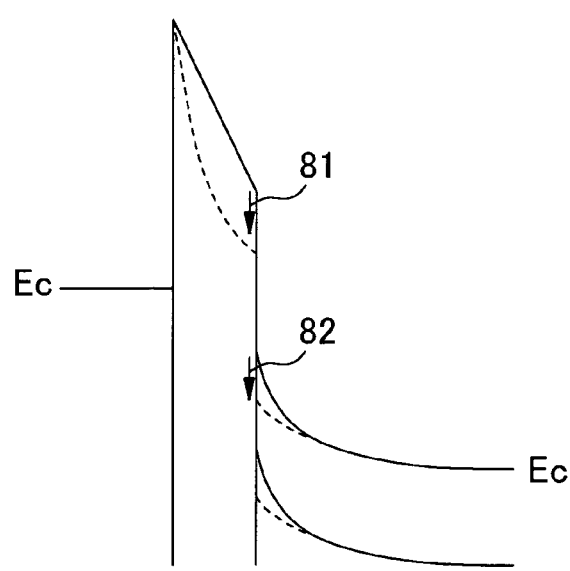

FIG. 23 schematically shows the potential distribution (energy band structure) along the line C—C in FIG. 22. In FIG. 23, the illustration of the laminated structure is omitted for the explanation of the electric field at the channel interface. That is, the potential distribution in the case where the laminated film 15 is formed as a single layer is shown for easy understanding. The horizontal axis of the graph in FIG. 23 corresponds to the distance or the position (arbitrary unit) in the thickness direction (direction vertical to the main surface of the semiconductor substrate 1) and the vertical axis of the graph in FIG. 23 corresponds to the energy band, in which the energy level Ec at the lower edge of the conductive band and the energy level Ev at the upper edge of the valence band at each position are shown. Actually, in the laminated film 15 comprised of a silicon oxide film, a silicon nitride film, and a silicon oxide film, the potential barrier height of the silicon nitride film being the inner (intermediate) layer is lower in comparison to the potential barrier height of the silicon oxide film being the outer layer.

Since the hole charge exists in the laminated insulator (laminated film 15) and the interface, the potential distribution in the insulator (laminated film 15) is shifted by the amount 81 shown by the arrow in FIG. 23, and also, the potential distribution in the semiconductor substrate (impurity diffusion layer 20) is shifted by the amount 82 shown by the arrow, and thus, the electric field in the vertical direction is also shifted and weakened. Accordingly, when the erasing (erasing operation) is performed, the generation of the holes is reduced, and the acceleration in the lateral direction by the electric field is also reduced. As a result, the erasing operation is not performed appropriately.

Figure 24:
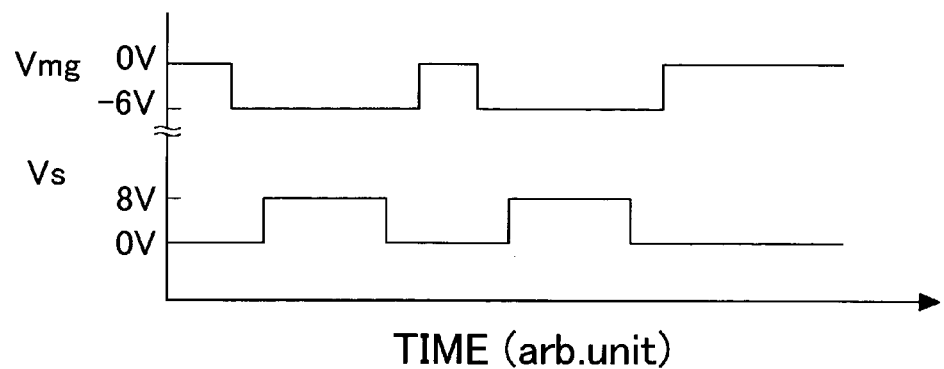
FIG. 24 is a graph showing the voltage pulse applied at the time of the erasing operation.

For its solution, the erasing pulse (in the erasing operation) is applied in twice (alternatively, several times more than twice). FIGS. 24 to 27 are the graphs of the voltage pulse applied at the time of the erasing operation. In FIGS. 24 to 27, the potential at each terminal is shown and the example of the operation timing is shown as the pulse shape. In FIG. 24, the erasing pulse (voltage pulse applied at the time of the erasing operation) with Vmg=−6 V and Vs=8 V is applied twice. When the erasing pulse (e.g., the voltage pulse for applying the negative potential to the memory gate 17 and applying the positive potential to the impurity diffusion layer 20 with setting the ground potential to the semiconductor substrate 1) is applied in twice or several times more than twice as described above, the holes trapped in the extremely shallow level in the surface are removed, and thus, it becomes possible to intensify the electric field, and also possible to further improve the erasing efficiency.

Figure 25:
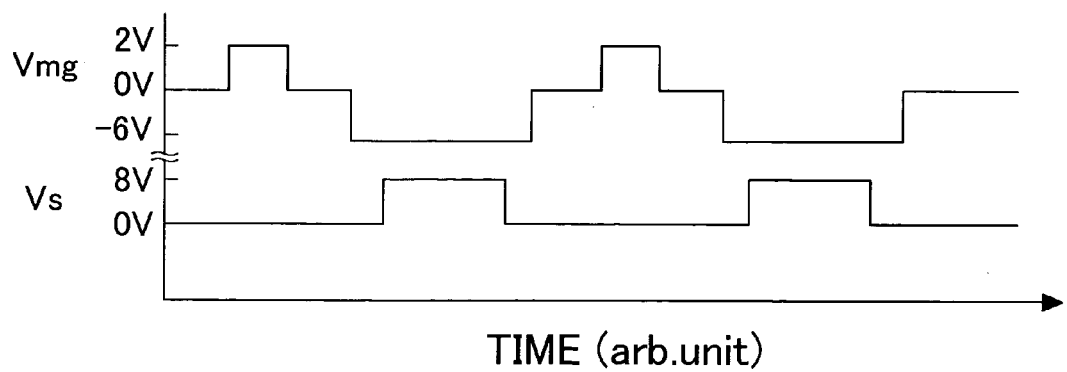
FIG. 25 is a graph showing the voltage pulse applied at the time of the erasing operation.
Figure 26:
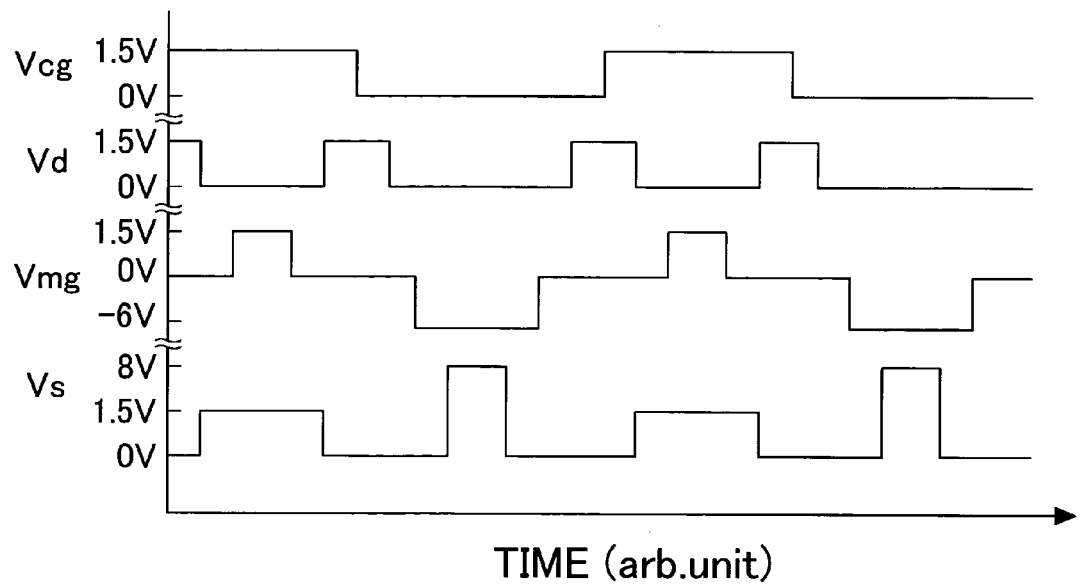
FIG. 26 is a graph showing the voltage pulse applied at the time of the erasing operation.

Also, as shown in FIG. 25, by applying the positive potential to Vmg (memory gate 17) (e.g., Vmg=2 V) before the erasing pulse, it becomes possible to perform the erasing operation under the condition that the holes on the surface are reduced and the electric field is intensified. In this manner, it is possible to further improve the erasing efficiency. In addition, as shown in FIG. 26, it is also possible to effectively remove the holes by taking the extremely weak writing state at the edge portion of the source (impurity diffusion layer 20) (before applying the erasing pulse).

Figure 27:
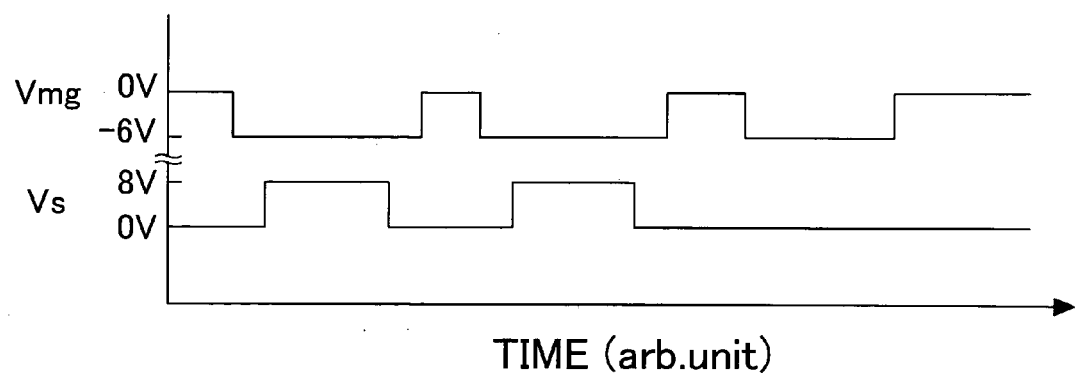
FIG. 27 is a graph showing the voltage pulse applied at the time of the erasing operation.

Furthermore, by applying the negative potential to Vmg (memory gate 17) (e.g., Vmg=−6 V) after applying the erasing pulse as described in FIG. 27, it becomes possible to move the unstable holes near the interface of the silicon oxide film (lowermost layer of the laminated film 15) to the more stable position. By doing so, it is possible to further improve the erasing efficiency. At this time, since it is unnecessary to generate the holes, Vs is held to the ground potential or the potential not generating the holes. In this manner, it is possible to save the power consumption.

In the above-described example, the case where pulses are applied several times has been described. For example, after the writing operation with Vmg=10 V, Vs=5 V, Vd=0 V, and Vcg=0.4 V, the potential of, for example, 12 V is applied only to Vmg. By doing so, it is possible to achieve more stable charge distribution than that just after the injection without applying the channel current. In this manner, it is possible to further reduce the change with time in the held charge. The same effect can be achieved also in the erasing operation.

(Second Embodiment)

FIGS. 28 to 31 are sectional views showing the principal part of the non-volatile semiconductor memory device (semiconductor device) in the fabrication process according to another embodiment of the present invention, in which the fabrication process of the polycrystalline silicon spacer 17b functioning as the memory gate 17 of the memory transistor is described. Since the fabrication process in this embodiment is identical to that in the first embodiment till the step shown in FIG. 7, the description thereof is omitted here.

Figure 28:
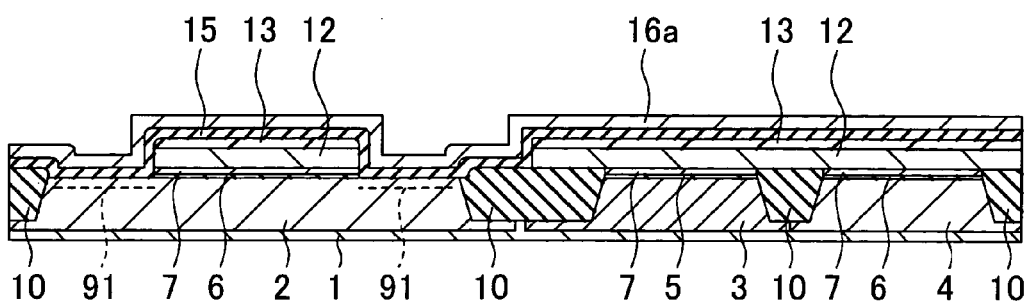
FIG. 28 is a sectional view showing the principal part of the non-volatile semiconductor memory device in the fabrication process according to another embodiment of the present invention.

After forming the structure shown in FIG. 7, a polycrystalline silicon film 16a doped with phosphorus is deposited above the entire surface of the semiconductor substrate 1 by the CVD method as shown in FIG. 28. The thickness of the deposited polycrystalline silicon film 16a is smaller than that of the polycrystalline silicon film 16 in the first embodiment. Then, a p-type impurity 91 (e.g., boron) is ion-implanted (ion implantation) with using the laminated film of the polycrystalline silicon film 7, the polycrystalline silicon film 12, and the silicon oxide film 13 (laminated structure for forming the selection gate 18) and the polycrystalline silicon film 16a thereon and on the sidewalls thereof as a mask. The case where the impurity 91 is ion-implanted is schematically shown in FIG. 28. However, the illustration of the ion-implanted impurity 91 is omitted in FIG. 29 and the subsequent drawings.

Figure 29:
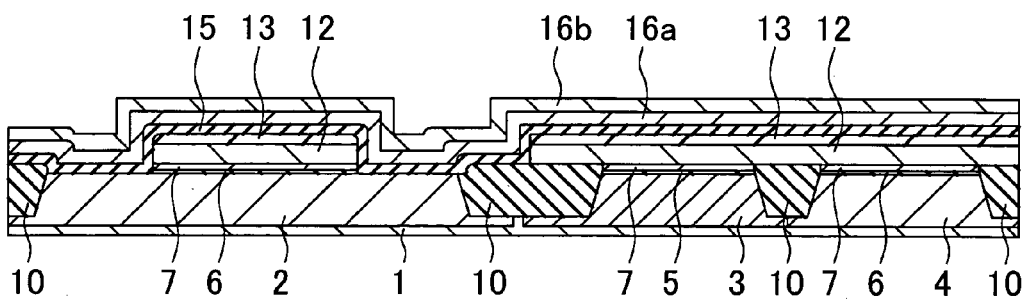
FIG. 29 is a sectional view showing the principal part at the step subsequent to FIG. 28 in the fabrication process of the non-volatile semiconductor memory device.

Next, as shown in FIG. 29, a polycrystalline silicon film 16b doped with phosphorus is deposited above the entire surface of the semiconductor substrate 1 by the CVD method. The total thickness of the polycrystalline silicon film 16a and the polycrystalline silicon film 16b corresponds to the deposition thickness of the polycrystalline silicon film 16 in the first embodiment and it is about 100 nm.

Figure 30:
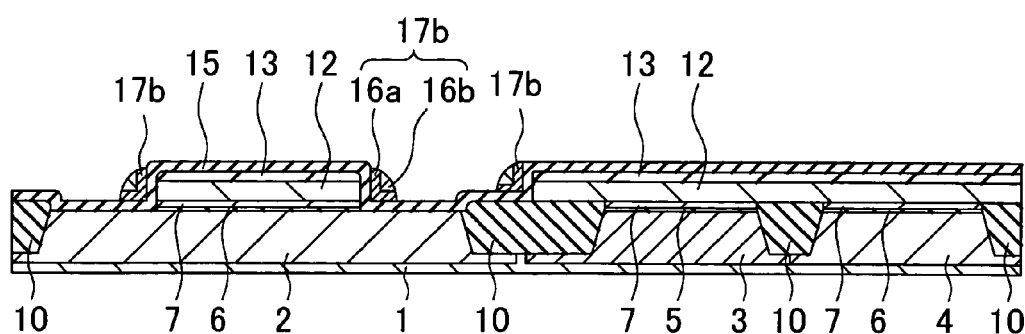
FIG. 30 is a sectional view showing the principal part at the step subsequent to FIG. 29 in the fabrication process of the non-volatile semiconductor memory device.

Then, as shown in FIG. 30, the polycrystalline silicon films 16a and 16b are etched (dry etching, anisotropic etching, etch back) by the thickness of the polycrystalline silicon films 16a and 16b (about 100 nm in this case). By doing so, polycrystalline silicon spacers 17b to be the memory gates (gate electrode) 17 are formed on the side surface of the selection gates. In this manner, the structure shown in FIG. 30 can be obtained. The structure shown in FIG. 30 corresponds to the structure shown in FIG. 10 in the first embodiment. As described above, the polycrystalline silicon spacer 17a in the first embodiment is comprised of a single layer of the polycrystalline silicon film 16. However, the polycrystalline silicon spacer 17b in this embodiment is comprised of (a laminated film of) the two layers of the polycrystalline silicon films 16a and 16b.

Figure 31:
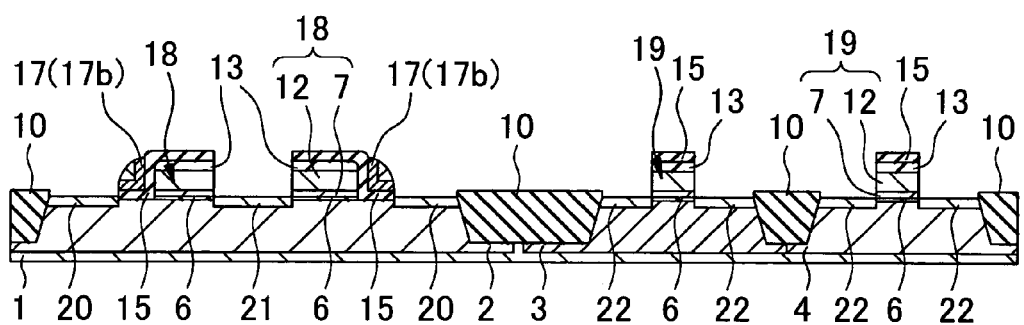
FIG. 31 is a sectional view showing the principal part at the step subsequent to FIG. 30 in the fabrication process of the non-volatile semiconductor memory device.

After the polycrystalline silicon film 17b is formed, the polycrystalline silicon film 7, the polycrystalline silicon film 12, the silicon oxide film 13, and the laminated film 15 are selectively removed in the same manner as that in the first embodiment as shown in FIG. 31, thereby forming the selection gate (gate electrode) 18 and the gate electrodes 19 of the peripheral transistors (transistors formed in the high breakdown voltage device region A2 and the device region A3). Subsequently, an n-type impurity such as arsenic is doped by using the ion implantation with using the memory gate 17, the selection gate 18, and the gate electrode 19 as the mask, thereby forming the impurity diffusion layers (impurity diffusion layer electrode) 20, 21, and 22 to be the source and drain (source and drain electrodes). Since the subsequent process in this embodiment is almost identical to the fabrication process in the first embodiment shown in FIG. 12 and the subsequent drawings, the description thereof is omitted here.

Figure 32:
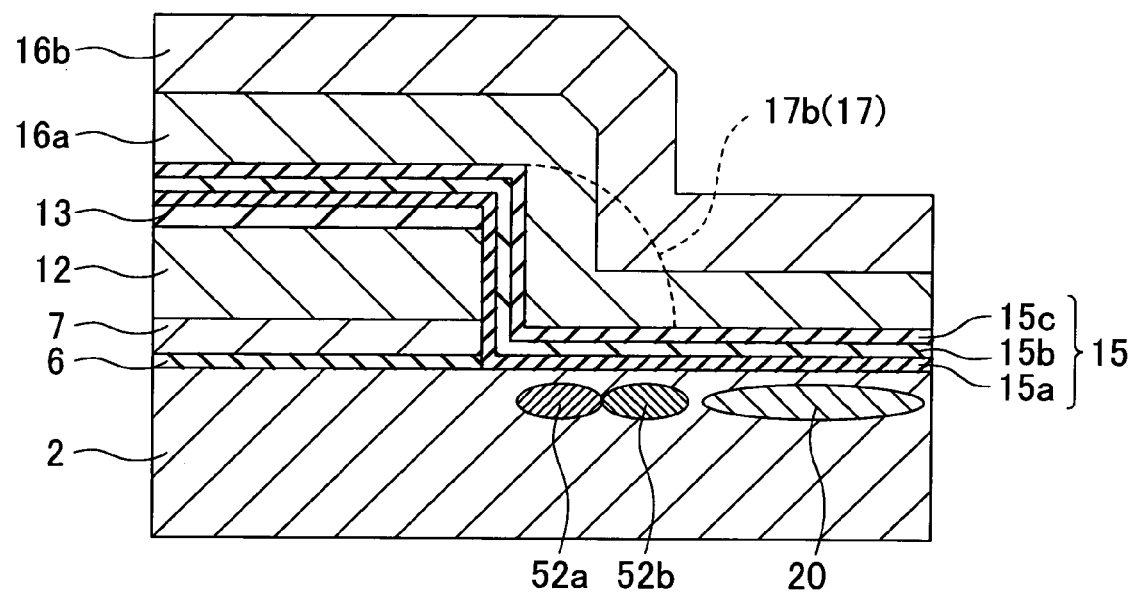
FIG. 32 is a partially enlarged sectional view of FIG. 29.

FIG. 32 is a partially enlarged sectional view of the non-volatile semiconductor memory device at the fabrication process shown in FIG. 29. In this embodiment, in the region (corresponding to the region 52 in FIG. 16) below the memory gate 17, the charge density of the impurity (impurity concentration) in the region 52a on the side close to the selection gate 18 is not equal to the charge density of the impurity (impurity concentration) in the region 52b on the side close to the impurity diffusion layer 20 (adjacent to the impurity diffusion layer 20) as shown in FIG. 32.

The charge density of the impurity (impurity concentration) in the region 52a can be adjusted and determined by controlling the amount (dose amount) of the ion implantation (of the impurity 14) performed after patterning the silicon oxide film 13, the polycrystalline silicon film 12, and the polycrystalline silicon film 7 to expose the region where the memory gate is to be formed and before forming the polycrystalline silicon film 16a. The impurity 14 is introduced to the regions 52a and 52b in this ion implantation (the impurity 14 is not introduced to the region 51 below the selection gate 18). Similar to the first embodiment, the charge density of the impurity in the region 52a can be made lower than that in the region 51 by using the n-type impurity as the impurity 14.

The charge density of the impurity (impurity concentration) in the region 52b can be adjusted and determined by controlling the amount (dose amount) of the ion implantation of the impurity 91 performed after forming the polycrystalline silicon film 16a and before forming the polycrystalline silicon film 16b. The impurity 91 is not introduced to the region 52a in this ion implantation. This is because the thickness of the polycrystalline silicon film 16 in the direction vertical to the main surface of the semiconductor substrate 1 is increased and functions as a mask in the portion above the region 52a ((because the laminated structure for forming) the selection gate 18 and the polycrystalline silicon films 16a on the sidewalls thereof function as the mask.). For example, the charge density of the impurity (impurity concentration) in the region 52b can be set higher than that in the region 52a.

Accordingly, since the p-type impurity is introduced (doped) to the region 51 and the p-type impurity and the n-type impurity are introduced (doped) to the region 52a and the region 52b, the p-type impurity concentration in the region 52b becomes higher than the p-type impurity concentration in the region 52a. Therefore, the charge density of the impurity in the p-type region 52b can be set higher than the charge density of the impurity in the p-type region 52a, and the charge density of the impurity in the p-type region 52a can be set lower than the charge density of the impurity in the p-type region 51.

In this manner, by increasing the p-type impurity concentration in the region 52b in order to increase the electric field (in the lateral direction by the PN junction with the impurity diffusion layer 20) and reducing the impurity concentration or doping the impurity with the opposite conductivity type (n-type impurity) into the region 52a to cancel the impurities in the channel region, (the charge density of the impurity is reduced and thus) the threshold value (of the memory gate 17) can be reduced. More specifically, by setting the p-type impurity concentration (charge density of the impurity) in the region 52b relatively high, the energy gradient (generated by the PN junction) between the impurity diffusion layer and the region 52b is made steep (the electric field is increased), and thus, the movement of the holes in the lateral direction from the impurity diffusion layer 20 to the region 52b can be facilitated. Also, by setting the charge density of the impurity in the region 52a lower than the charge density of the impurity in the region 52b, it becomes possible to prevent the increase of the threshold value of the memory transistor. Consequently, it becomes possible to minutely control the electric field in the region below the memory gate.

(Third Embodiment)

Figure 33:
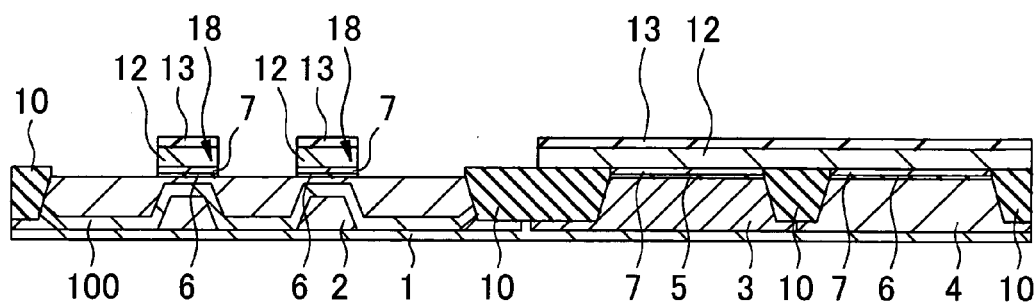
FIG. 33 is a sectional view showing the principal part of the non-volatile semiconductor memory device in the fabrication process according to another embodiment of the present invention.

FIG. 33 is a sectional view showing the principal part of the non-volatile semiconductor memory device (semiconductor device) in the fabrication process according to still another embodiment of the present invention. Since the fabrication process in this embodiment is identical to that in the first embodiment till the step shown in FIG. 5, the description thereof is omitted here.

In this embodiment, after the process for the selection gate 18, the ion implantation is performed through the selection gate 18 into the channel surface below the selection gate 18. In this manner, an impurity layer 100 is formed. More specifically, after forming the structure shown in FIG. 5, (a laminated film of) the silicon oxide film 13, the polycrystalline silicon film 12, and the polycrystalline silicon film 7 are selectively etched and patterned by using the photolithography method and the dry etching method, thereby forming the selection gates 18 in the memory cell region A1 as shown in FIG. 33. Subsequently, a p-type impurity (e.g., boron) is ion-implanted (ion implantation) with using (the laminated film of) the patterned polycrystalline silicon film 7, the polycrystalline silicon film 12, and the silicon oxide film 13 as a mask. At this time, the energy of the ion implantation (implantation depth) is adjusted so that the impurity can be implanted to the channel region (surface) below the selection gate 18 through the selection gate 18. By this ion implantation, the p-type impurity diffusion layer 100 with a relatively high impurity concentration is formed. Since the subsequent process in this embodiment is almost identical to the fabrication process in the first embodiment shown in FIG. 7 and the subsequent drawings except that the patterning of the selection gate 18 is unnecessary, the description thereof is omitted here.

In the region below the selection gate 18, the impurity diffusion layer 100 is formed on the surface of the semiconductor substrate 1. Therefore, it is possible to set the impurity concentration (charge density of the impurity) in the channel region below the selection gate 18 to be relatively high. Meanwhile, since (the laminated film of) the silicon oxide film 13, the polycrystalline silicon film 12, and the polycrystalline silicon film 7 serving as a mask of the ion implantation are not formed in the region where the memory gate 17 is to be formed, the impurity is deeply implanted, and thus, the impurity diffusion layer 100 is formed in the relatively deep region of the semiconductor substrate 1 (e.g., in the region at the depth equivalent to the total thickness of the selection gate 18 and the silicon oxide film 13 thereon). Therefore, the charge density of the impurity (impurity concentration) in the channel region below the memory gate 17 formed later is not influenced by the ion implantation (ion implantation for forming the impurity diffusion layer 100). Accordingly, the charge density of the impurity (impurity concentration) in the channel region (region 51) of the selection gate 18 can be set different from the charge density of the impurity (impurity concentration) in the channel region (region 52) of the memory gate 17, and the charge density of the impurity in the channel region of the selection gate 18 can be set higher than the charge density of the impurity in the channel region of the memory gate 17. By doing so (by forming the impurity diffusion layer 100), it becomes possible to set the threshold value of the selection gate 18 without changing the threshold value of the memory gate 17.

Also, since the impurity diffusion layer 100 is formed by the ion implantation of the impurity with the same conductivity type (p-type in this case) into the p-type well 2 in this embodiment, the ion implantation of the impurity with the opposite conductivity type (n-type in this case) into the p-type well 2 is unnecessary. Therefore, the regions below the selection gate and the memory gate can be adjusted to have a desirable impurity concentration (profile). In addition, since it is possible to determine (form) the selection gate 18 by the single patterning process, the variation in the channel length in the selection gate 18 can be reduced.

Also, in this embodiment, the memory gates 17 (polycrystalline silicon spacers 17a) are formed on both sides of the selection gate 18. Therefore, by doping the impurity to the high concentration into the one side of the selection gate 18 (region where the impurity diffusion layer 21 is to be formed) after the process (formation) of the selection gate 18, the impurity diffusion layer (diffusion layer electrode) 21 is formed, and thus, it becomes possible to prevent the influence from the spacer gate (polycrystalline silicon spacer 17a) formed on the diffusion layer electrode 21 after the formation of the diffusion layer electrode 21. In addition, it is also possible to remove the unnecessary portion of the spacer gates (polycrystalline silicon spacer 17a) by the use of the patterning. At this time, since the laminated film 15 with a relatively large thickness is provided under the spacer gate, the unnecessary portion of the spacer gates (polycrystalline silicon spacer 17a) can be easily removed.

(Fourth Embodiment)

Figure 34:
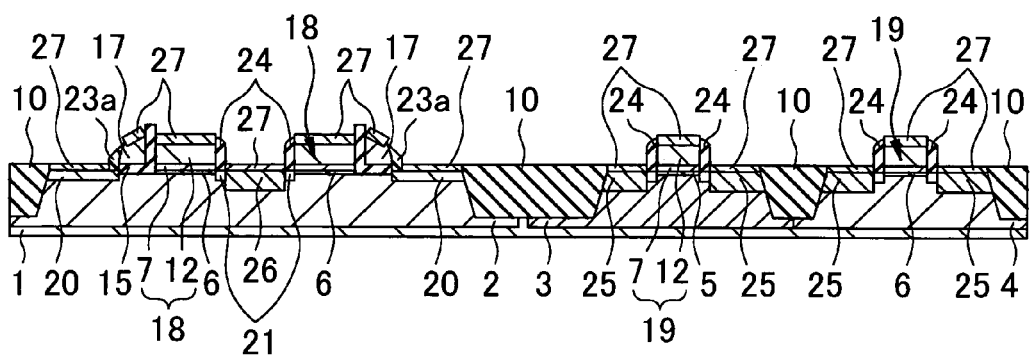
FIG. 34 is a sectional view showing the principal part of the non-volatile semiconductor memory device in the fabrication process according to another embodiment of the present invention.

FIG. 34 is a sectional view showing the principal part of the non-volatile semiconductor memory device (semiconductor device) in the fabrication process according to still another embodiment of the present invention, which corresponds to the process step of the first embodiment shown in FIG. 12. Since the fabrication process in this embodiment is identical to that in the first embodiment till the step shown in FIG. 10, the description thereof is omitted here.

In the first embodiment, the spacers 23 are used as the covers (protection insulator) for preventing the short-circuit between the memory gate and the selection gate 18 and the short-circuit between the memory gate and the impurity diffusion layer 20 in the process for forming the silicide layer 27 (salicide process), and the impurity diffusion layer 20 is also covered with the spacer 23. Since the short-circuit can be prevented if the insulator spacer is left on the side surface of the memory gate, the spacers 23a (corresponding to the spacer 23 in the first embodiment) are formed by the etch back (anisotropic etching) of the silicon oxide film for forming the spacers so as to cover the side surfaces of the memory gate 17, and the silicidation is performed under the condition that almost all of the impurity diffusion layer 20 is exposed except the region near the memory gate in this embodiment. In this manner, the part of the memory gate 17 and the part of the surface portion of the impurity diffusion layer 20 are silicided to form the silicide layer 27 as shown in FIG. 34. The bridging is prevented by the spacers 23 in the first embodiment. However, in the case of the silicide of Ni, the salicidation can be achieved without any bridging.

In the foregoing, the invention made by the inventor of the present invention has been concretely described based on the embodiments. However, it is needless to say that the present invention is not limited to the foregoing embodiments and various modifications and alterations can be made within the scope of the present invention.

The effect obtained by the typical ones of the inventions disclosed in this application will be briefly described as follows.

That is, it is possible to provide a non-volatile semiconductor memory device with good wiring/erasing characteristics by controlling the charge density of the impurity in the channel region controlled by the selection gate constituting the memory cell and that in the channel region controlled by the memory gate.

What is claimed is:

1. A non-volatile semiconductor memory device, comprising:
    a semiconductor substrate;
    first and second semiconductor regions of a first conductivity type formed in said semiconductor substrate;
    a first channel region and a second channel region between said first semiconductor region and said second semiconductor region in said semiconductor substrate, said first channel region being located on the side close to said first semiconductor region and said second channel region being located on the side close to said second semiconductor region;
    a first gate formed above said first channel region via a first insulator; and
    a second gate formed above said second channel region via a second insulator,
    wherein said non-volatile memory is enabled to perform at least a writing operation, an erasing operation and a charge holding operation, and such that in the writing operation electrons are injected into said second insulator, in the erasing operation holes are injected into said second insulator and in the holding operation charges are held in said second insulator, and
    wherein the charge density of an impurity in said first channel region is different from the charge density of an impurity in said second channel region.

2. The non-volatile semiconductor memory device according to claim 1,
    wherein the charge density of an impurity in said second channel region is lower than the charge density of an impurity in said first channel region.

3. The non-volatile semiconductor memory device according to claim 1,
    wherein an impurity of a second conductivity type, opposite to said first conductivity type, is introduced into said first channel region, and the impurity of the first conductivity type and the impurity of the second conductivity type are introduced into said second channel region.

4. The non-volatile semiconductor memory device according to claim 1,
    wherein said second insulator is a laminated film of a silicon oxide film, a silicon nitride film, and a silicon oxide film.

5. The non-volatile semiconductor memory device according to claim 1,
    wherein the thickness of said second insulator is larger than the thickness of said first insulator.

6. The non-volatile semiconductor memory device according to claim 1,
    wherein the charge density of an impurity in said second channel region is set within the range of $10^{17}/cm^3$ to $10^{18}/cm^3$.

7. The non-volatile semiconductor memory device according to claim 1,
    wherein said second gate is adjacent to said first gate via said second insulator.

8. A non-volatile semiconductor memory device, comprising:
    a semiconductor substrate;
    first and second semiconductor regions of a first conductivity type formed in said semiconductor substrate;
    a first channel region and a second channel region between said first semiconductor region and said second semiconductor region in said semiconductor substrate, said first channel region being located on the side close to said first semiconductor region and said second channel region being located on the side close to said second semiconductor region;
    a first gate formed above said first channel region via a first insulator; and
    a second gate formed above said second channel region via a second insulator,
    wherein said non-volatile memory is enabled to perform at least a writing operation, an erasing operation and a charge holding operation, and such that in the writing operation electrons are injected into said second insulator and in the erasing operation holes are injected into said second insulator, in the erasing operation holes are injected into said second insulator and in the holding operation charges are held in said second insulator, and
    wherein said second channel region includes a first region on the side close to said second semiconductor region and a second region on the side close to said first channel region, and the charge density of an impurity in said first region is higher than the charge density of an impurity in said second region.

9. The non-volatile semiconductor memory device according to claim 8,
    wherein the impurity concentration of the second conductivity type, opposite to said first conductivity type, of said first region is higher than the impurity concentration of the second conductivity type of said second region.

10. The non-volatile semiconductor memory device according to claim 8,
    wherein the impurity of the second conductivity type is introduced into said first channel region, the impurity of the first conductivity type and the impurity of the second conductivity type are introduced into said second channel region, and the impurity concentration of the second conductivity type of said first region is higher than the impurity concentration of the second conductivity type of said second region.

11. The non-volatile semiconductor memory device according to claim 10,
wherein said second insulator is a laminated film of a silicon oxide film, a silicon nitride film, and a silicon oxide film.

12. The non-volatile semiconductor memory device according to claim 8,
wherein said second insulator is a laminated film of a silicon oxide film, a silicon nitride film, and a silicon oxide film.

13. The non-volatile semiconductor memory device according to claim 8,
wherein the charge density of an impurity in said first channel region is higher than the charge density of an impurity in said second region.

14. The non-volatile semiconductor memory device according to claim 13,
wherein said second insulator is a laminated film of a silicon oxide film, a silicon nitride film, and a silicon oxide film.

15. The non-volatile semiconductor memory device according to claim 8,
wherein said second gate is adjacent to said first gate via said second insulator.

16. The non-volatile semiconductor memory device according to claim 15,
wherein said second insulator is a laminated film of a silicon oxide film, a silicon nitride film, and a silicon oxide film.

* * * * *